United States Patent
Gwon et al.

(10) Patent No.: US 10,955,952 B2
(45) Date of Patent: Mar. 23, 2021

(54) DISPLAY PANEL HAVING BUILT-IN TOUCHSCREEN, DISPLAY DEVICE HAVING BUILT-IN TOUCH SCREEN, INTEGRATED DRIVING CIRCUIT, AND DRIVING METHOD

(71) Applicant: LG Display Co., Ltd., Seoul (KR)

(72) Inventors: Hyangmyoung Gwon, Paju-si (KR); JiHyun Jung, Paju-si (KR); SuChang An, Seoul (KR); JaeGyun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/842,575

(22) Filed: Apr. 7, 2020

(65) Prior Publication Data

US 2020/0233522 A1 Jul. 23, 2020

Related U.S. Application Data

(63) Continuation of application No. 15/372,319, filed on Dec. 7, 2016, now Pat. No. 10,678,368.

(30) Foreign Application Priority Data

Aug. 31, 2016 (KR) .......................... 10-2016-0111624

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/04164* (2019.05);
(Continued)

(58) Field of Classification Search
None
See application file for complete search history.

(56) References Cited

U.S. PATENT DOCUMENTS 8,537,126 B2 9/2013 Yousefpor et al.
9,098,161 B2 8/2015 Shin et al.
(Continued)

FOREIGN PATENT DOCUMENTS

CN 101943961 A 1/2011
CN 104699315 A 6/2015
(Continued)

OTHER PUBLICATIONS

European Extended Search Report, European Application No. 16206679.9, dated Jul. 17, 2017, 8 pages.
(Continued)

*Primary Examiner* — Carl Adams
(74) *Attorney, Agent, or Firm* — Fenwick & West LLP

(57) ABSTRACT

A display panel having a built-in touchscreen, a display device having a built-in touchscreen, an integrated driving circuit, and a driving method. The display panel includes an integrated pad electrically connected to an integrated driving circuit, a data line electrically connected to the integrated pad, and a touch line electrically connected to the integrated pad. The data line is electrically connected to and the touch line. The display device includes the display panel.

12 Claims, 29 Drawing Sheets

(51) Int. Cl.
*H01L 27/32* (2006.01)
*H01L 51/52* (2006.01)
*G02F 1/1333* (2006.01)
*G09G 3/3233* (2016.01)

(52) U.S. Cl.
CPC ........ *G06F 3/04166* (2019.05); *H01L 27/323* (2013.01); *H01L 27/3276* (2013.01); *H01L 51/5253* (2013.01); *G02F 1/13338* (2013.01); *G06F 2203/04112* (2013.01); *G09G 3/3233* (2013.01)

(56) References Cited

U.S. PATENT DOCUMENTS

| | | | |
|---|---|---|---|
| 9,293,078 | B2 | 3/2016 | Shin et al. |
| 9,430,963 | B2 | 8/2016 | Shin et al. |
| 9,703,440 | B2 | 7/2017 | Li et al. |
| 9,733,755 | B2 | 8/2017 | Yang |
| 10,120,502 | B2 | 11/2018 | Yang et al. |
| 10,185,450 | B2 | 1/2019 | Liu et al. |
| 10,289,252 | B2 | 5/2019 | Cok |
| 10,466,832 | B2 | 11/2019 | Zhai |
| 2006/0176251 | A1 | 8/2006 | Park et al. |
| 2010/0253638 | A1 | 10/2010 | Yousefpor et al. |
| 2012/0098776 | A1 | 4/2012 | Chen et al. |
| 2015/0177880 | A1 | 6/2015 | Shin et al. |
| 2015/0287381 | A1* | 10/2015 | Kim ...................... G06F 3/0418 345/174 |
| 2015/0301639 | A1 | 10/2015 | Shin et al. |
| 2016/0012766 | A1 | 1/2016 | Shin et al. |
| 2016/0103537 | A1* | 4/2016 | Park .................... G06F 3/04164 345/174 |
| 2016/0291724 | A1 | 10/2016 | Li et al. |
| 2016/0291784 | A1 | 10/2016 | Zhai |
| 2016/0328072 | A1 | 11/2016 | Yang |
| 2017/0102797 | A1 | 4/2017 | Cok |
| 2017/0185222 | A1 | 6/2017 | Yang et al. |
| 2017/0322650 | A1 | 11/2017 | Liu et al. |

FOREIGN PATENT DOCUMENTS

| | | |
|---|---|---|
| CN | 104731426 A | 6/2015 |
| CN | 104777955 A | 7/2015 |
| CN | 104915060 A | 9/2015 |
| CN | 105094422 A | 11/2015 |
| CN | 105717715 A | 6/2016 |
| EP | 2453339 A1 | 5/2012 |
| EP | 2879026 A1 | 6/2015 |
| EP | 2887185 A1 | 6/2015 |

OTHER PUBLICATIONS

United States Office Action, U.S. Appl. No. 15/372,319, Sep. 11, 2019, 14 pages.
United States Office Action, U.S. Appl. No. 15/372,319, dated May 20, 2019, 15 pages.
United States Office Action, U.S. Appl. No. 15/372,319, dated Dec. 13, 2018, 14 pages.
United States Office Action, U.S. Appl. No. 15/372,319, dated Jun. 15, 2018, 11 pages.

* cited by examiner

MESH TYPE

MESH TYPE

BULK TYPE

DISPLAY PANEL HAVING BUILT-IN TOUCHSCREEN, DISPLAY DEVICE HAVING BUILT-IN TOUCH SCREEN, INTEGRATED DRIVING CIRCUIT, AND DRIVING METHOD

CROSS REFERENCE TO RELATED APPLICATION

This application is a continuation of U.S. patent application Ser. No. 15/372,319 filed on Dec. 7, 2016 which claims priority from Korean Patent Application Number 10-2016-0111624 filed on Aug. 31, 2016, each which is hereby incorporated by reference for all purposes as if fully set forth herein.

BACKGROUND

Field

Exemplary embodiments of the present disclosure relate to a display panel having a built-in touchscreen, a display device having a built-in touchscreen, an integrated driving circuit, and a driving method.

Description of Related Art

In response to the development of the information society, demand for a variety of display devices for displaying images is increasing. In this regard, a range of display devices, such as liquid crystal display (LCD) devices, plasma display panels (PDPs), and organic light-emitting display devices, have recently been used.

Many display devices provide touch-based input interfaces enabling users to intuitively and conveniently input data or instructions directly to devices, rather than using conventional input systems, such as buttons, a keyboard, or a mouse.

To provide such touch-based input interfaces, the ability to sense a touch made by a user and accurately detect touch coordinates is required.

In this regard, in the related art, a touch sensing method selected from among a variety of methods of touch sensing, such as resistive touch sensing, capacitive touch sensing, electromagnetic induction, infrared (IR) touch sensing, and ultrasonic touch sensing, is used to enable touch sensing.

In such a variety of touch sensing methods, capacitive touch sensing is commonly used, in which a number of touch electrodes are disposed on a touchscreen panel (TSP) to detect a touch and touch coordinates based on changes in capacitance between specific touch electrodes or changes in the capacitance between specific touch electrodes and a pointer, such as a finger.

A range of attempts at disposing a touchscreen panel including electrodes in a display panel have been made in order to facilitate the fabrication of display devices and reduce the sizes of display devices.

However, in a display panel having a built-in touchscreen, pads through which image driving signals are supplied to image display signal lines and pads through which touch sensing signals are supplied to touch electrodes must be formed on such a display panel. This is problematic because it increases the number of pads.

An increased number of pads in a display panel having a built-in touchscreen also increases the number of pads required in a driving circuit for image display and the number of pads required in a driving circuit for touch sensing, both of which are problematic.

In addition, organic light-emitting display devices can be fabricated to be relatively light and thin, since organic electroluminescent (EL) devices or organic light-emitting diodes (OLEDs) able to emit light themselves are commonly used therein and a separate light source is not required. In addition, organic light-emitting display devices are not only advantageous in terms of power consumption, since they are driven at low voltages, but also have desirable qualities, such as the ability to implement a range of colors, rapid response rates, wide viewing angles, and high contrast ratios. Thus, organic light-emitting display devices for next-generation displays have been actively researched.

However, organic light-emitting display devices have complexity and difficulty in processing in that an encapsulation layer to protect against moisture, air, physical impacts, or impurities that may be introduced during fabrication processing to achieve reliability.

In addition, in the fabrication of organic light-emitting display panels, organic materials make high-temperature processing difficult.

Such structural characteristics and processing limitations of organic light-emitting display panels make it difficult to dispose touch electrodes within organic light-emitting display panels. It is therefore difficult to realize organic light-emitting display panels respectively having a built-in touchscreen panel.

Therefore, in related-art organic light-emitting display devices, a touch structure has been realized by attaching a touchscreen panel to an organic light-emitting display panel.

In this case, the touchscreen panel must be fabricated separately from the organic light-emitting display panel before being attached to the organic light-emitting display panel, thereby making a fabrication process complicated and increasing the thickness of the resultant organic light-emitting display device.

BRIEF SUMMARY

Various aspects of the present disclosure provide a display panel having a built-in touchscreen, a display device having a built-in touchscreen, an integrated driving circuit, and a driving method able to reduce the number of pads required.

Also provided are a display panel having a built-in touchscreen, in which a data voltage for data driving and a touch driving signal for touch driving can be received using the same integrated pad, a display device including the display panel having a built-in touchscreen, an integrated driving circuit, and a driving method.

Also provided are an organic light-emitting display panel having a built-in touchscreen, an organic light-emitting display device having a built-in touchscreen, an integrated driving circuit, and a driving method.

Also provided are a display panel having a built-in touchscreen, the panel structure of which enables a touch structure to be disposed within an organic light-emitting display panel having more advantages than other types of display panels, a display device having a built-in touchscreen, an integrated driving circuit, and a driving method.

According to an aspect of the present disclosure, a display device having a built-in touchscreen may include: a display panel on which a number of subpixels are defined by a number of data lines and a number of gate lines and a number of touch electrodes are disposed; and an integrated driving circuit driving the data lines and the touch electrodes.

The display panel may further include touch lines disposed thereon, the touch lines electrically connecting the touch electrodes to the integrated driving circuit.

The touch lines may be electrically connected to the data lines.

According to another aspect of the present disclosure, a display panel having a built-in touchscreen may include: an integrated pad electrically connected to an integrated driving circuit; a data line electrically connected to the integrated pad; a subpixel receiving an image data voltage from the data line; and a touch line electrically connected to the integrated pad.

In the display panel having a built-in touchscreen, identical signals may be applied to the data line and the touch line, since the data line is electrically connected to the touch line.

According to further another aspect of the present disclosure, a driving method of a display device having a built-in touchscreen may include: outputting subpixel-specific data voltages sequentially to data lines disposed on a display panel in a display mode period; and outputting touch driving signals to touch lines electrically connected to touch electrodes disposed on the display panel in a touch mode period.

In the driving method, subpixel-specific data voltages signals may be applied to the touch lines electrically connected to the data lines in the display mode period.

In addition, touch driving signals may be applied to the data lines electrically connected to the touch lines in the touch mode period.

According to another aspect of the present disclosure, a display device having a built-in touchscreen may include: a display panel on which a number of subpixels are defined by a number of data lines and a number of gate lines and a number of touch electrodes are disposed thereon; and a driving circuit driving the data lines and the touch electrodes.

In the display device, the display panel may include: a first electrode; an organic light-emitting layer located on the first electrode; a second electrode located on the organic light-emitting layer; an encapsulation layer disposed on the second electrode; and a number of touch lines and a number of touch electrodes disposed on the encapsulation layer.

In the display device, the touch electrodes do not overlap each other, and the touch lines do not overlap each other.

In the display device, the touch lines may be electrically connected to the data lines in a corresponding manner.

According to further another aspect of the present disclosure, a display panel having a built-in touchscreen may include: a number of data lines; a number of gate lines; and a number of subpixels defined by the data lines and the gate lines.

In the display panel, each of the subpixels may include: an organic light-emitting diode; a driving transmitter driving the organic light-emitting diode; a first transistor electrically connected between a first node of the driving transmitter and a corresponding data line among the data lines; and a storage capacitor electrically connected between the first node and a second node of the driving transistor.

In each of the subpixels, the organic light-emitting device may include: a first electrode located in an area of each of the subpixels and electrically connected to the second node of the driving transistor; a second electrode commonly located in areas of an entirety of the subpixels, wherein a base voltage is applied to the second electrode; and an organic light-emitting layer disposed between the first electrode and the second electrode.

The display panel may further include: an encapsulation layer located on the second electrode; and a number of touch electrodes and a number of touch lines located on the encapsulation layer.

In the display panel, the touch lines do not overlap each other, and the touch electrodes do not overlap each other.

The touch lines may be electrically connected to the touch electrodes in a corresponding manner.

The touch electrodes do not overlap each other.

The touch lines and the touch electrodes may be located on the encapsulation layer, and may be located on the same layer or different layers.

The touch lines may overlap or may not overlap the touch electrodes.

According to another aspect of the present disclosure, an integrated driving circuit of a display device having a built-in touchscreen may include: a data driving circuit outputting a data voltage to be supplied to a data line in a display mode period; a touch driving circuit outputting a touch driving signal to be supplied to a touch electrode in a touch mode period; a first input node through which the data voltage output by the data driving circuit is input; a second input node through which the touch driving signal output by the touch driving circuit is input; an output node electrically connected to an integrated pad commonly connected to the data line and the touch electrode; and a switch electrically connecting one of the first input node and the second input node to the output node depending on driving modes.

According to still another aspect of the present disclosure, a display device having a built-in touchscreen may include: a number of data lines to which data voltages are applied; a number of gate lines to which scanning signals are applied; a number of subpixels defined by the number of data lines and the number of gate lines; and a number of touch electrodes to which touch driving signals are applied.

In the display device, each of the subpixels may include: an organic light-emitting device; a driving transistor driving the organic light-emitting device; a first transistor electrically connected between a first node of the driving transistor and a corresponding data line among the data lines; and a storage capacitor electrically connected between the first node and a second node of the driving transistor.

A drain node or a source node of the first transistor may be electrically connected to a corresponding touch electrode among the touch electrodes (through the corresponding data line).

According to the present disclosure, the display panel having a built-in touchscreen, the display device having a built-in touchscreen, the integrated driving circuit, and the driving method, able to reduce the number of pads required, are provided.

In addition, according to the present disclosure, the display panel having a built-in touchscreen, in which a data voltage for data driving and a touch driving signal for touch driving can be received using the same integrated pad, the display device including the display panel having a built-in touchscreen, the integrated driving circuit, and the driving method are provided.

Furthermore, according to the present disclosure, the organic light-emitting display panel having a built-in touchscreen, the organic light-emitting display device having a built-in touchscreen, the integrated driving circuit, and the driving method are provided.

In addition, according to the present disclosure, touch electrodes are formed on an encapsulation layer in an organic light-emitting display panel having more advantages than other types of display panels, thereby advantageously reducing material costs and investment costs due to the omission of a conventional in-cell standard process. In addition, since the touch electrodes are formed on the encapsulation layer, it is not required to bond a touch panel including the touch electrodes to the organic light-emitting display panel. This consequently removes bonding tolerances as well as the thickness of bonded materials, thereby being advantageous in terms of implementing a high resolution and a high aperture ratio.

In one embodiment, a display device comprises a display panel or may be the display panel. The display panel includes a plurality of subpixels defined by a plurality of data lines and a plurality of gate lines. The display panel also includes a plurality of touch electrodes, a plurality of pads, and a plurality of touch lines. The touch lines are electrically connected to corresponding touch electrodes of the plurality of touch electrodes, electrically connected to corresponding data lines of the plurality of data lines and electrically connected to corresponding pads of the plurality of pads.

In one embodiment, an integrated driving circuit is electrically connected to the plurality of pads. The integrated driving circuit drives the data lines and the touch lines via the pads.

In one embodiment, a driving method of a display device is disclosed. The display device includes data lines electrically connected to subpixels. The display device also has touch lines electrically connected to touch electrodes. The method comprises during a display mode period, outputting data voltages to the data lines of the display device and to the touch lines of the display device that are electrically connected to the data lines. Additionally, the method comprises, during a touch mode period, outputting touch driving signals to the touch lines of the display device and to the data lines of the display device that are electrically connected to the touch lines.

In one embodiment, an integrated driving circuit for a display device is disclosed. The integrated driving circuit comprises a data driving circuit to output data voltages and a touch driving circuit to output a touch driving signal. The integrated driving circuit also comprises a first input node through which the data voltages is input, a second input node through which the touch driving signal is input, and an output node for making an electrical connection to the display device. The integrated driving circuit also comprises a switching circuit electrically connecting one of the first input node and the second input node to the output node depending on whether a driving mode is a display driving mode or a touch driving mode.

BRIEF DESCRIPTION OF THE DRAWINGS

The above and other objects, features and advantages of the present disclosure will be more clearly understood from the following detailed description when taken in conjunction with the accompanying drawings, in which.

DETAILED DESCRIPTION

Figure 1:
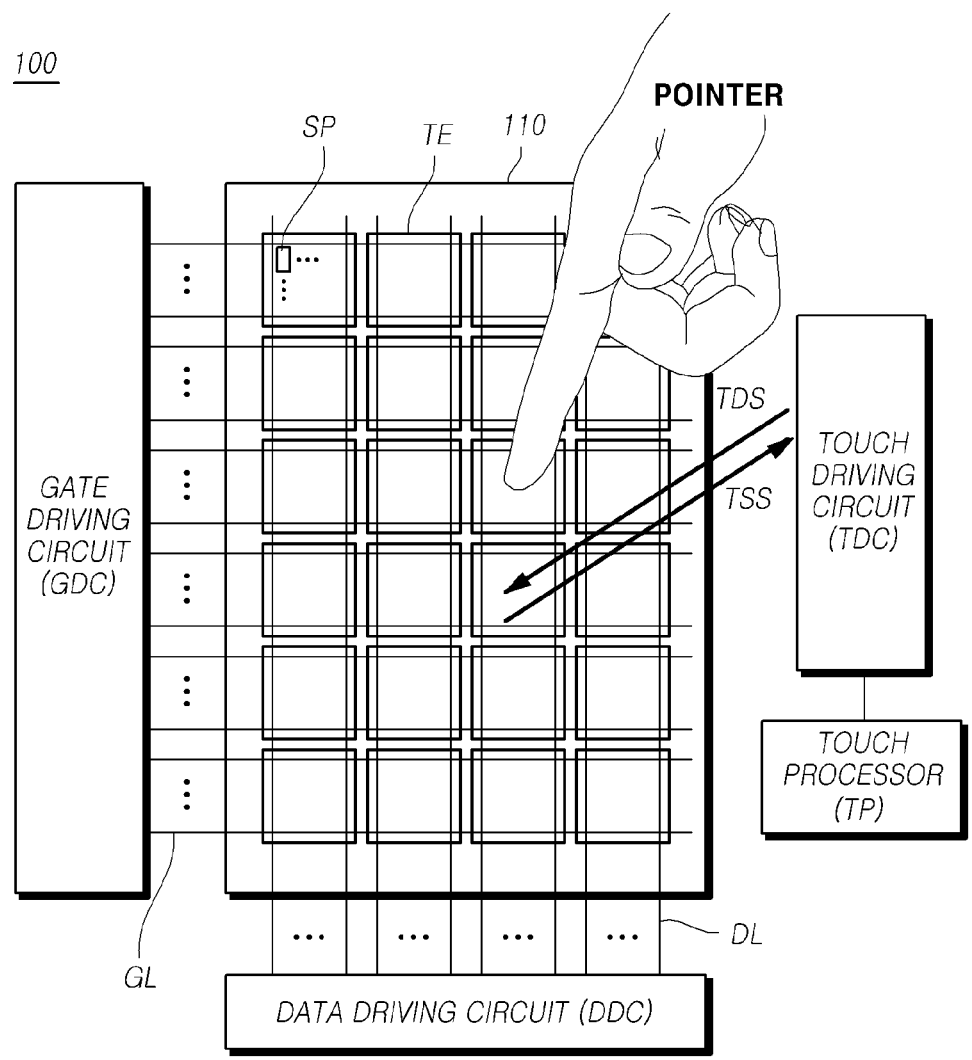
FIG. 1 is a schematic view illustrating a display device having a built-in touchscreen according to exemplary embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are only used to distinguish one element from another element. The substance, sequence, order or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being "on" or "under" another element, not only can it be directly on or under another element, but it can also be indirectly on or under another element via an intervening element.

FIG. 1 is a schematic view illustrating a display device 100 having a built-in touchscreen according to exemplary embodiments.

Referring to FIG. 1, the display device 100 having a built-in touchscreen according to exemplary embodiments includes a display panel 110, a variety of circuits, and so on.

The display device 100 having a built-in touchscreen according to exemplary embodiments can perform a display function to display images and a touch function to sense a touch made using a pointer, such as a finger or a stylus.

Thus, the display device 100 having a built-in touchscreen according to exemplary embodiments can operate in a display mode to perform the display function during a display mode period or in a touch mode period to perform the touch function during a touch mode period. The display mode period and the touch mode period may be divided on a temporal basis, may be simultaneous within the same period of time, or may overlap on a temporal basis. In one embodiment, the display mode period and touch mode period are different periods of time within a single frame period. That is, the display mode operation for displaying images and the touch mode operation for performing touch sensing can be performed separately or simultaneously.

In the display panel 110 according to exemplary embodiments, a number of data lines DL for displaying images and a number of gate lines GL are provided, and a number of subpixels SP defined by the data lines DL and the gate lines GL are provided.

The display panel 110 according to exemplary embodiments can also act as a touchscreen panel (TSP). Thus, a number of touch electrodes TE acting as touch sensors for touch sensing are arranged on the display panel 110 according to exemplary embodiments. In this sense, the display panel 110 according to exemplary embodiments is referred to as the "display panel 110 having a built-in touchscreen." Such a display device including the display panel 110 having a built-in touchscreen will be referred to as the display device 100 having a built-in touchscreen.

Referring to FIG. 1, the display device 100 having a built-in touchscreen includes a data driving circuit DDC and a gate driving circuit GDC to drive the display panel 110 during the display mode period. The source driving circuit DDC drives the number of data lines DL, while the gate driving circuit GDC drives the number of gate lines GL. The display device 100 further includes at least one controller to control the operation timing of the data driving circuit DDC and the gate driving circuit GDC or the supply of power to the source driving circuit DDC and the gate driving circuit GDS.

Referring to FIG. 1, the display device 100 having a built-in touchscreen includes a touch driving circuit TDC, a touch processor TP, and so on, to drive the display panel 110 during the touch driving mode. The touch driving circuit TDC drives the number of touch electrodes TE, while the touch processor TP determines the occurrence of a touch and/or a touched position based on signals received from the touch electrodes TE to which touch driving signals TDS are applied during the touch mode period.

The touch driving circuit TDC can supply the touch driving signals TDS to the number of touch electrodes TE to drive the number of touch electrodes TE. In addition, the touch driving circuit TDC can receive touch sensing signals TSS from the touch electrodes TE to which the touch driving signals TDS are supplied. The touch driving circuit TDC supplies the received touch sensing signals TSS or sensing data obtained by processing the received touch sensing signals TSS to the touch processor TP.

The touch processor TP can execute a touch algorithm using the touch sensing signals TSS or the sensing data and determine the occurrence of a touch and/or the touched position.

As described above, the display device 100 having a built-in touchscreen according to exemplary embodiments uses self-capacitance based touch sensing that determines the occurrence of a touch and/or the touched position by detecting a change in the self-capacitance between each of the touch electrodes TE and the pointer.

In the display device 100 having a built-in touchscreen according to exemplary embodiments, the touch driving signals TDS are applied to the touch electrodes TE and the touch sensing signals TSS are detected from the touch electrodes TE.

Thus, in the display device 100 having a built-in touchscreen according to exemplary embodiments, the electrodes (also referred to as driving electrodes or Tx electrodes) for enabling touch driving in response to the touch driving signals TDS being applied thereto may not be provided separately from the electrodes (also referred to as sensing electrodes or Rx electrodes) for detecting the touch sensing signals TSS, thereby facilitating panel processing.

The data driving circuit DDC, the gate driving circuit GDC, the touch driving circuit TDC, and the touch processor TP as described above are categorized according to function. In In some cases, two or more of the source driving circuit SDC, the gate driving circuit GDC, the touch driving circuit TDC, and the touch processor TP may be integrated with each other.

Figure 2:
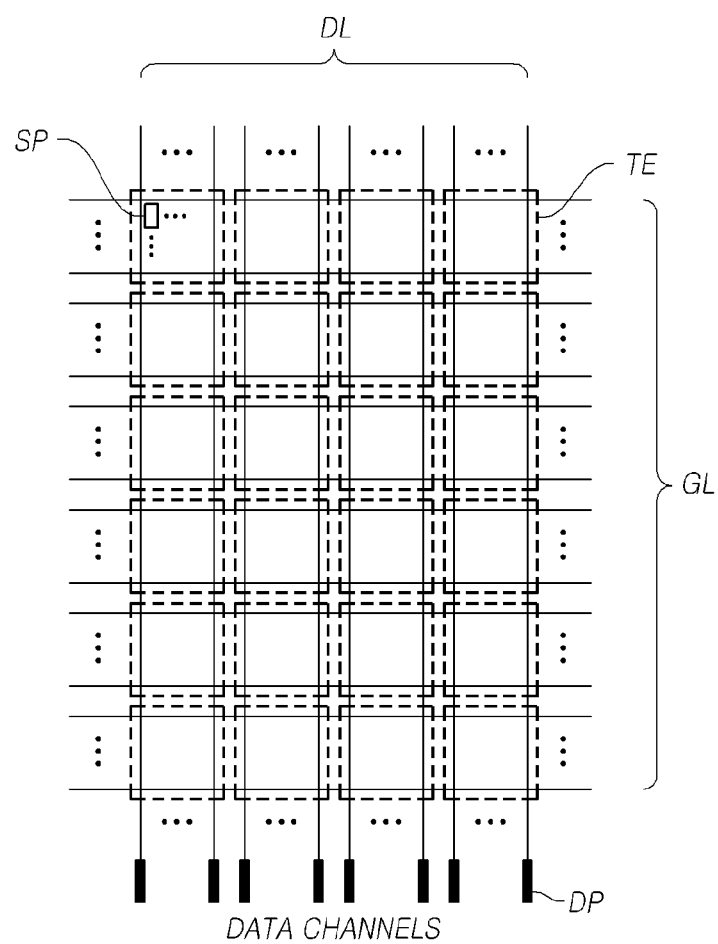
FIG. 2 is a schematic view illustrating a display driving configuration of the display panel having a built-in touchscreen according to exemplary embodiments.

FIG. 2 is a schematic view illustrating a display driving configuration of the display panel 110 having a built-in touchscreen according to exemplary embodiments.

Referring to FIG. 2, on the display panel 110 having a built-in touchscreen according to exemplary embodiments, a number of data lines DL and a number of gate lines GL are provided to enable display driving, and a number of subpixels SP are defined by the number of data lines DL and the number of gate lines GL.

Although the area of a single touch electrode TE may be equal or similar to the area of a single subpixel, the area of the single touch electrode TE may be equal to the area of two or more subpixels to increase the efficiency of touch sensing.

Referring to FIG. 2, image data voltages VDATA for displaying an image are supplied to the number of data lines DL by a data driving circuit DDC. Thus, a configuration electrically connecting the data lines DL to corresponding data channels (points through which corresponding data voltages are output) on the data driving circuit DDC is required. In this regard, the data driving circuit DDC may be electrically connected to pad regions on the peripheral area of the display panel 110 using a chip-on-film (COF) method or a chip-on-glass (COG) method.

A number of data pads DP are disposed in the pad regions located in the peripheral area (also referred to as a non-display area, a bezel area, or a non-active area) of the display panel 110 that surrounds the display area. The data pads DP are electrically connected to the data lines DL in a corresponding manner, and are electrically connected to data channels of the data driving circuit DDC in a corresponding manner. Thus, the data pads DP must be formed on the peripheral area of the display panel 110, and a number of the data pads PD is equal to the number of the data lines DL (i.e. the number of the data channels) to deliver data voltages VDATA output by the data driving circuit DDC to the corresponding data lines DL.

Although not shown in FIG. 2, gate pads electrically connecting the gate lines GL to the gate driving circuit GDC may be disposed on the display panel 110.

Figure 3:
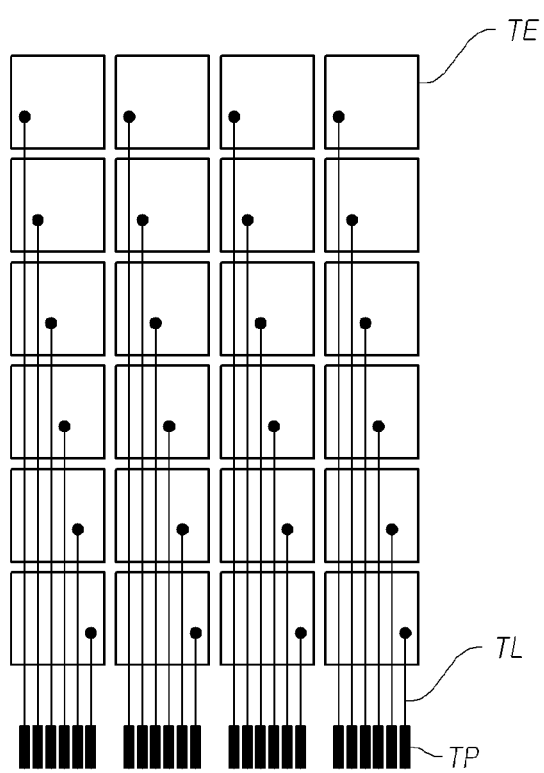
FIG. 3 is a schematic view illustrating touch driving configurations of the display panel having a built-in touchscreen according to exemplary embodiments.

FIG. 3 is a schematic view illustrating touch driving configurations of the display panel 110 having a built-in touchscreen according to exemplary embodiments.

Referring to FIG. 3, the display panel 110 having a built-in touchscreen according to exemplary embodiments requires a number of touch electrodes TE and a number of touch lines TL disposed thereon for touch driving, in which the touch electrodes TE act as touch sensors, and signals are delivered from the number of touch electrodes TE to the touch driving circuit TDC through the number of touch lines TL and vice versa.

The number of touch lines TL electrically connect the number of touch electrodes TE and the touch driving circuit TDC. Thus, the display panel 110 has a number of touch pads TP equal to the number of the touch lines (i.e. the number of touch channels) to electrically connect the number of touch lines TL and the touch driving circuit TDC.

As illustrated in FIG. 2 and FIG. 3, the display panel 110 having a built-in touchscreen is operated in both a display mode period and a touch mode period. Thus, a number of data line pads DP as well as the number of touch pads TP must be disposed on the display panel 110 having a built-in touchscreen, thereby requiring a greater number of pads.

A greater number of pads may be required depending on the size and resolution of the display panel 110 having a built-in touchscreen, variations in touch sensing, and improvements in the accuracy of touch sensing. Since a greater number of pads are required, it is more difficult to design the display panel 110 having a built-in touchscreen and the structures of the driving circuits are more complicated.

Figure 4:
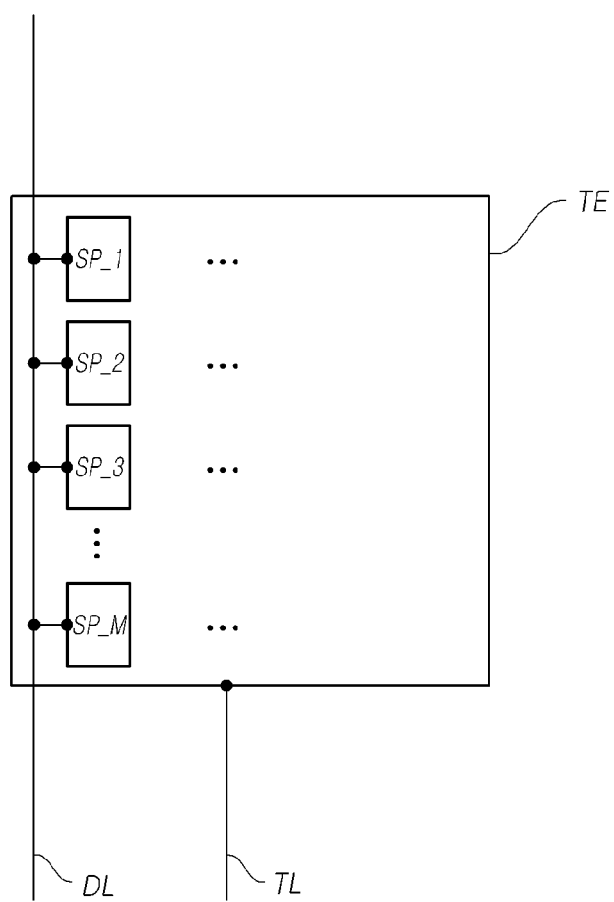
FIG. 4 is schematic view illustrating a single touch electrode and M number of subpixels of the display panel having a built-in touchscreen according to exemplary embodiments, the M number of subpixels being located in the area of the single touch electrode and connected to a single data line.
Figure 5:
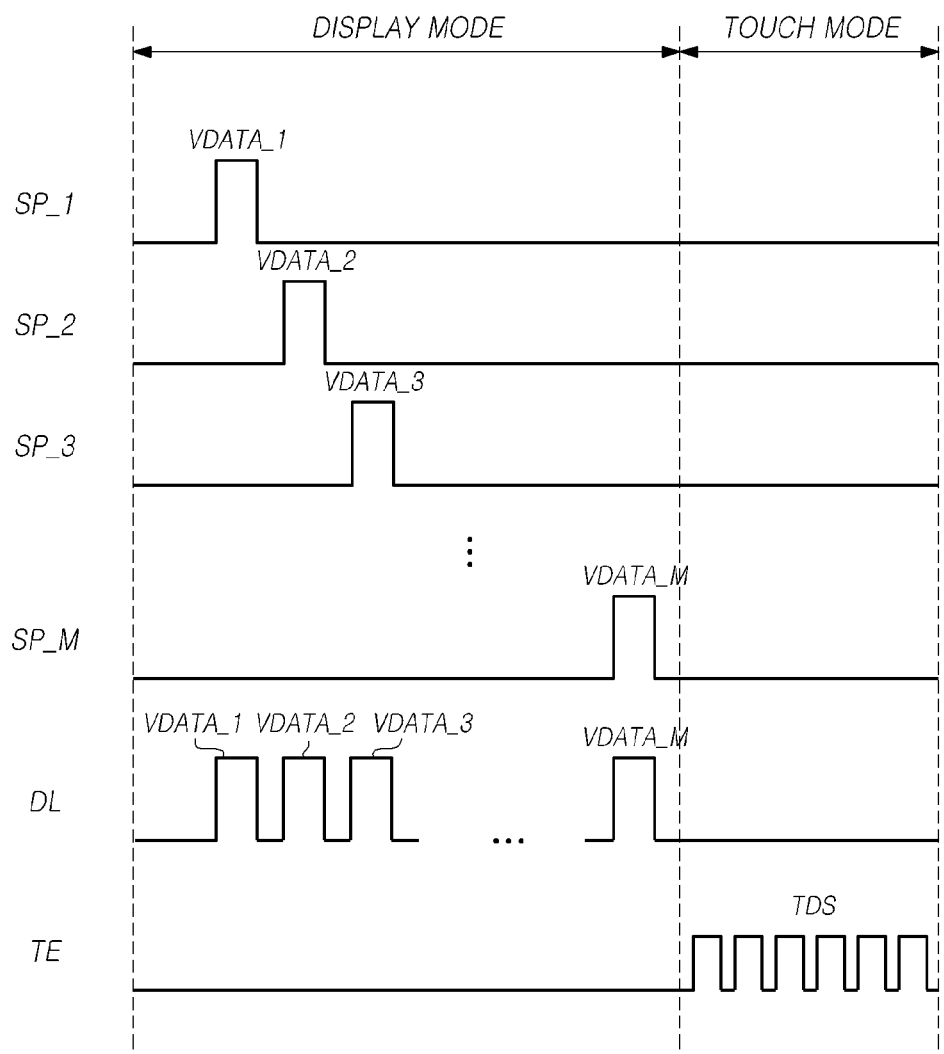
FIG. 5 is a schematic view illustrating signals applied to the data line and the touch electrode illustrated in FIG. 4 during a display mode period and a touch mode period.

FIG. 4 is schematic view illustrating a single touch electrode TE and M number of subpixels SP_1, SP_2, SP_3, . . . , and SP_M of the display panel 110 having a built-in touchscreen according to exemplary embodiments, the M number of subpixels SP_1 to SP_M being located in the area of the single touch electrode TE and connected to a single data line DL. FIG. 5 is a schematic view illustrating signals applied to the data line DL and the touch electrode TE illustrated in FIG. 4 during a display mode period and a touch mode period.

FIG. 4 schematically illustrates an area in which the single touch electrode TE and a column of the M number of subpixels are located. Here, M is a natural number equal to or greater than 1.

A single touch line TL, through which a touch driving signal TDS and a touch sensing signal TSS are delivered, is electrically connected to the single touch electrode TE. At least one data line DL may pass through the area in which the single touch electrode TE is located. M number of subpixels SP_1 to SP_M are electrically connected to the single data line DL illustrated in FIG. 4.

Referring to FIG. 5, during the display mode period, the data driving circuit DDC outputs data voltages VDATA_1, VDATA_2, . . . , and VDATA_M sequentially to the single data line DL, wherein the data voltages are intended to be supplied to the M number of subpixels SP_1 to SP_M.

Each of the M number of subpixels SP_1 to SP_M can be selectively supplied with a corresponding data voltage through sequential scanning of the column of the M number of subpixels. That is, the subpixel SP_1 is only supplied with the data voltage VDATA_1, and then the subpixel SP_2 is only supplied with the data voltage VDATA_2.

However, all of the data voltages VDATA_1 to VDATA_M are supplied sequentially to the single data line DL to which the M number of subpixels SP_1 to SP_M are commonly connected.

During this display mode period, the touch electrode TE may be in a floating state in which no signals are applied thereto or a state in which a specific voltage (e.g. a ground voltage) is applied thereto.

Referring to FIG. 5, during the touch mode period, the touch driving circuit TDC outputs a touch driving signal TDS to the corresponding touch electrode TE through the touch line TL.

During this touch mode period, each of the data line DL and the subpixels SP_1 to SP_M may be in a floating state in which no signals are applied thereto or a state in which a specific voltage (e.g. a ground voltage) is applied thereto.

The structure of FIG. 4 and the signal waveform of FIG. 5 correspond to the case in which the data pad DP and the touch pad TP are provided separately in the display panel 110.

Hereinafter, a scheme of reducing the number of pads in the display panel 110 will be described.

Hereinafter, as examples of the scheme of reducing the number of pads, an integrated driving method (or combined driving method) of performing data driving and touch driving in a combined manner using integrated pads, as well as a signal line connection structure and an integrated driving circuit, will be described. Hereinafter, while a case in which touch lines TL are arranged in the same direction as data lines DL will be used as an example, the present disclosure is not limited thereto.

Referring to the integrated driving according to exemplary embodiments, data voltages for data driving and touch driving signals for touch driving are supplied to the display panel 110 through the same pads (hereinafter referred to as integrated pads).

Supposing that the touch lines TL and the gate lines GL are arranged in the same direction, an integrated driving method, a signal line connection structure for the integrated driving method, and an integrated driving circuit that will be described hereinafter can be applied equally to integrated driving in which gate driving and touch driving are performed in a combined manner.

Briefly described, the gate lines are electrically connected to the touch lines. In this case, during the display mode period, the gate driver IC can output gate signals (i.e. scanning signals) through the integrated pads to which the gate lines and the touch lines are electrically connected. During the touch driving modes, the gate driver IC can output touch driving signals to the touch lines through the integrated pads.

Figure 6:
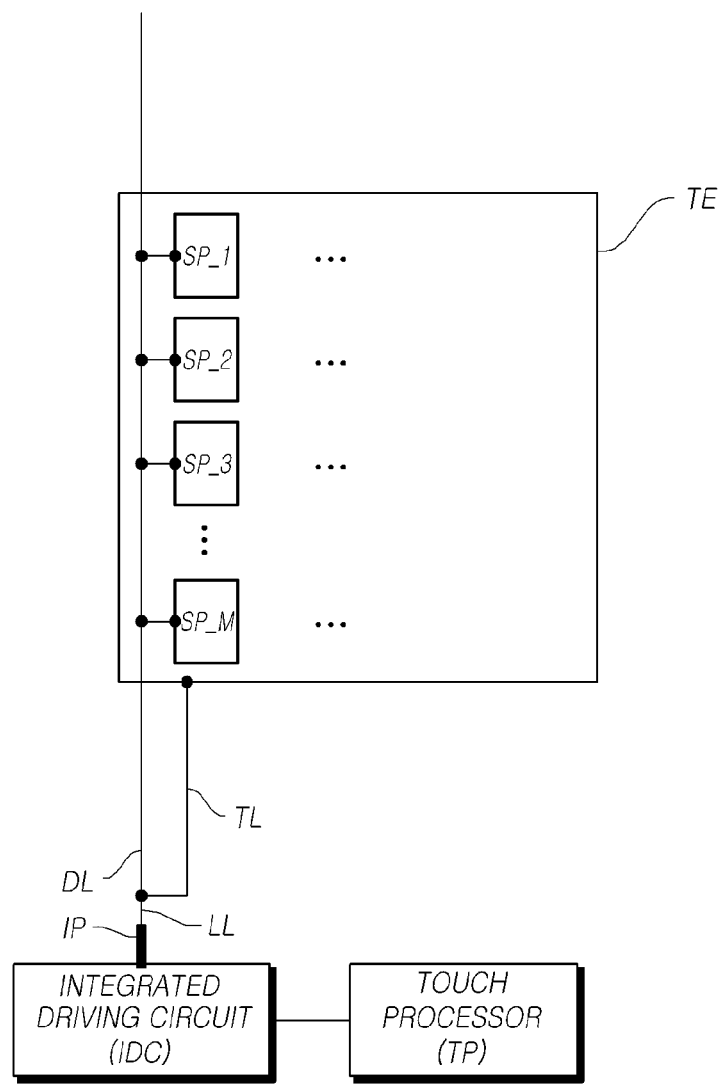
FIG. 6 is a schematic view illustrating an integrated driving system for data driving and touch driving according to exemplary embodiments.

FIG. 6 is a schematic view illustrating an integrated driving system for data driving and touch driving according to exemplary embodiments.

Like FIG. 4, FIG. 6 illustrates a single touch electrode TE and M number of subpixels SP_1, SP_2, . . . , and SP_M in the display panel 110 having a built-in touchscreen, the M number of subpixels SP_1 to SP_M being located in the area of the single touch electrode TE and connected to a single data line DL.

Referring to FIG. 6, the integrated driving system for data driving and touch driving according to exemplary embodiments includes an integrated driving circuit IDC driving data lines DL and touch electrodes TE.

The integrated driving circuit IDC can provide the function of a data driving circuit DDC and the function of a touch driving circuit TDC in a combined manner.

In addition, the integrated driving system for data driving and touch driving according to exemplary embodiments includes a signal line connecting structure for driving the data lines DL and the touch electrodes TE in a combined manner.

More specifically, touch lines TL electrically connecting the touch electrodes TE to the integrated driving circuit IDC are further disposed on the display panel 110, and the data lines DL are electrically connected to the touch lines TL.

Referring to FIG. 6, a link line LL extending from or electrically connected to the data line DL is disposed in the peripheral area of the display panel 110. The link line LL is electrically connected to both the data line DL and the touch line TL.

An integrated pad IP is disposed in a location of the peripheral area of the display panel 110 to which the IDC is connected. The integrated pad IP is electrically connected to the link line LL.

Thus, the data pads DP and the touch pads TP are not required to be disposed separately on the display panel 110, and the number of pads can be significantly reduced. That is, the total number of pads on the display panel 110 can be reduced by the number of the touch pads (i.e. the number of the touch electrodes).

Figure 7:
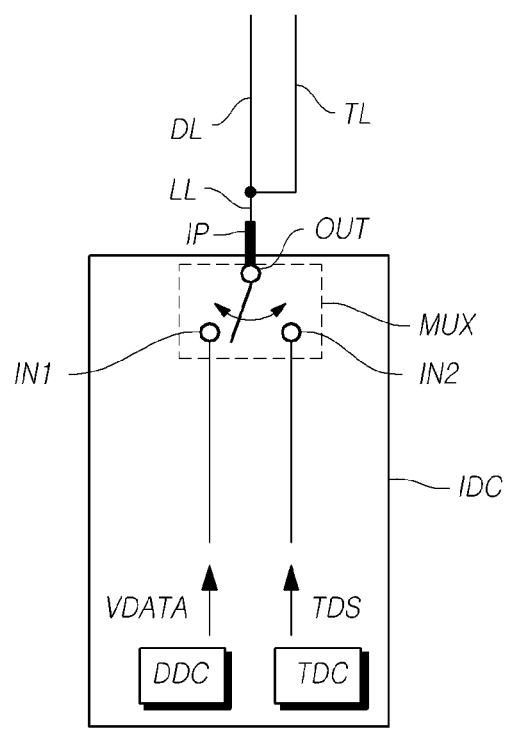
FIG. 7 is an integrated driving circuit according to exemplary embodiments.

FIG. 7 is an integrated driving circuit IDC according to exemplary embodiments.

Referring to FIG. 7, the integrated driving circuit IDC includes a data driving circuit DDC, a touch driving circuit TDC, a first input node IN1, a second input node IN2, an output node OUT, a switching circuit MUX, and so on.

The data driving circuit DDC converts digital sub-pixel values (e.g. 8 bit values) into analog data voltages VDATA. The data driving circuit DDC can output data voltages VDATA to be supplied to data lines DL during a display mode period. The data driving circuit DDC includes at least one latch, a digital-to-analog converter (DAC), an output buffer, and so on.

The touch driving circuit TDC can output touch driving signals to be supplied to touch electrodes TE during a touch mode period. The touch driving circuit TDC includes an amplifier, an integrator, an analog-to-digital converter (ADC), and so on.

The first signal input node IN1 receives data voltages VDATA output by the data driving circuit DDC. The second signal input node IN2 receives touch driving signals TDS output by the touch driving circuit TDC.

The signal output node OUT can be a pin or pad of the integrated driving circuit IDC used for making external connections to components outside of the integrated driving circuit IDC. The signal output node OUT is electrically connected to an integrated pad IP commonly connected to a data line DL and a touch electrode TE. The integrated pad IP is connected to a link line LL, which is connected to both the data line DL and a touch line TL. Thus, the signal output node OUT can output data voltages VDATA or touch driving signals TDS to both the data line DL and the touch line TL through the link line LL.

The switching circuit MUX can electrically connect one of the first input node IN1 and the second signal input node IN2 to the signal output node OUT depending on the current driving mode (i.e. the display mode or the touch mode). The switching circuit MUX can be implemented, for example, as a multiplexer.

The use of the integrated driving circuit IDC as described above can perform data driving and touch driving in a combined manner and output both a data voltage VDATA for data driving and a touch driving signal TDS for touch driving using a single integrated pad (i.e. via a single identical link line LL). Thus, the number of the output nodes (i.e. the number of the output pads) of the integrated driving circuit IDC can be significantly reduced.

Thus, the integrated driving circuit IDC according to exemplary embodiments can use only a smaller number of output channels, thereby simplifying the design of the circuits as well as facilitating the process of designing the same.

In addition, the use of the integrated driving circuit IDC according to exemplary embodiments can reduce the number of the pads of the display panel 110.

In addition, the touch line TL can be electrically connected to the data line DL in the peripheral area (i.e. the pad area or the surroundings thereof) of the display panel 110.

The touch line TL can be electrically connected to the data line DL in an area in which the corresponding touch electrode TE is located instead of the peripheral area (i.e. the pad area or the surroundings thereof) of the display panel 110.

Figure 8:
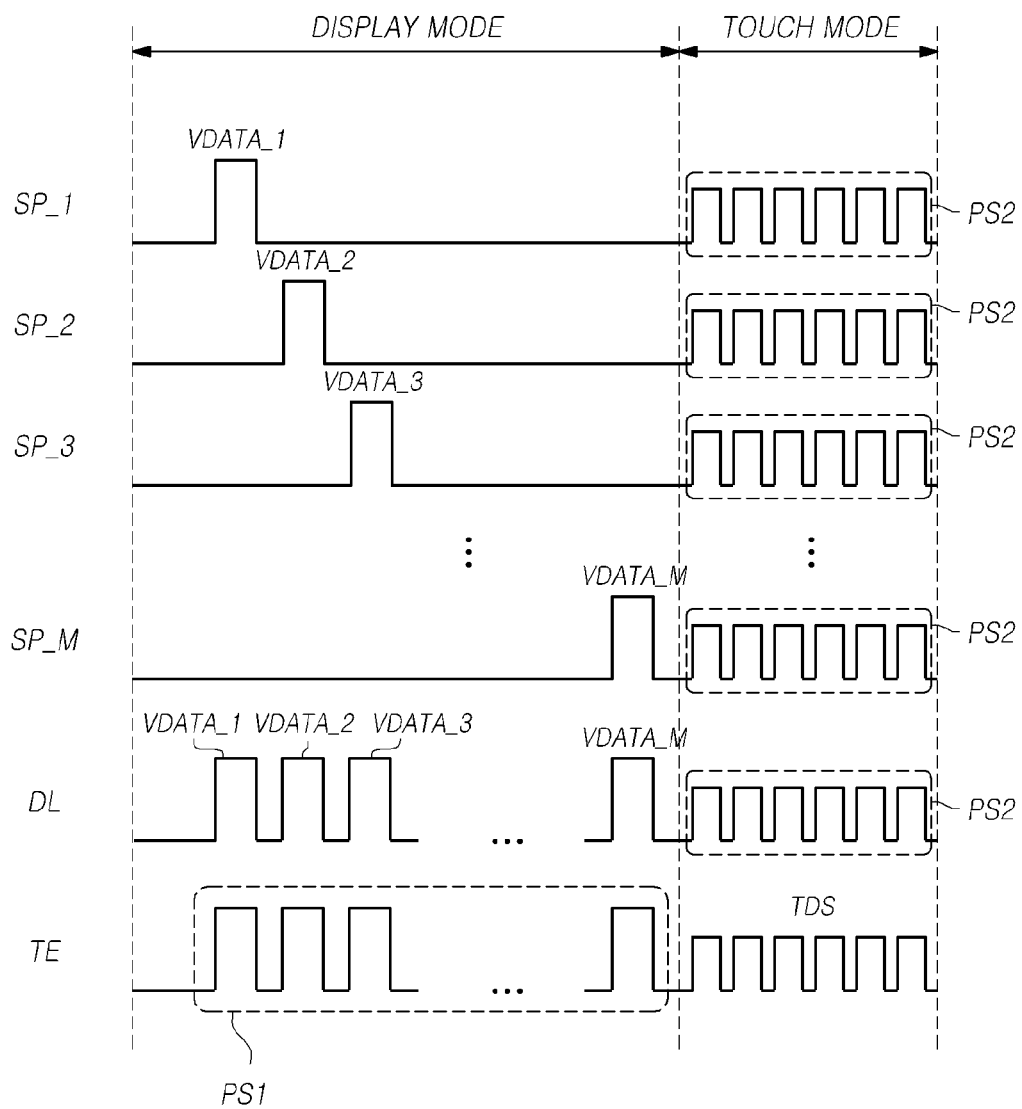
FIG. 8 is a schematic view illustrating signals applied to a data line and a touch electrode during a display mode period and a touch mode period according to integrated driving according to exemplary embodiments.

FIG. 8 is a schematic view illustrating signals applied to a data line DL and a touch electrode TE during a display mode period and a touch mode period according to integrated driving according to exemplary embodiments.

FIG. 8 illustrates signals applied to M number of subpixels SP_1 to SP_M, a data line DL commonly connected to the M number of subpixels SP_1 to SP_M, and a single touch electrode TE located in an area in which the M number of subpixels SP_1 to SP_M are located, respectively, in the structure illustrated in FIG. 6 when integrated driving of data driving and touch driving is performed.

Referring to FIG. 8, during the display mode period, the data driving circuit DDC of the integrated driving circuit IDC outputs M number of data voltages VDATA_1 to VDATA_M sequentially, the M number of data voltages being intended to be supplied to M number of subpixels SP_1 to SP_M.

During the display mode period, the switch MUX of the integrated driving circuit IDC connects the first input node IN1 and the output node OUT.

Thus, the M number of data voltages VDATA_1 to VDATA_M are output sequentially to the integrated pad IP through the output node OUT.

As described above, the number of data voltages VDATA_1 to VDATA_M output sequentially from the integrated driving circuit IDC are supplied simultaneously to the data line DL and the touch line TL through the link line LL.

Referring to FIG. 8, a first pulse signal PS1 can be applied to the touch line TL during the display mode period. Thus, it can be observed that the first pulse signal PS1 is applied to the touch electrode TE connected to the touch line TL.

In the case in which at least two subpixels are connected to a single data line DL, the data line DL is electrically connected to the subpixels. Thus, during the display mode period, the first pulse signal PS1 applied to the touch line TL may be data voltages VDATA_1 to VDATA_M supplied sequentially to the at least two subpixels SP electrically connected to the data line DL.

That is, the first pulse signal PS1 looks like a signal comprised of at least two pulses due to sequential combinations of at least two data voltages.

When the sections of the at least two data voltages are continuous, the first pulse signals PS1 may look like a single pulse.

As described above, during the display mode period, a signal (i.e. the first pulse signal PS1) comprised of one or two pulses, appearing due to the sequential combination of at least two data voltages, is also applied to the touch line TL and the touch electrode TE that are used in touch driving.

Referring to FIG. 8, during the touch mode period, the touch driving circuit TDC of the integrated driving circuit IDC outputs a touch driving signal TDS.

During the touch mode period, the switch MUX of the integrated driving circuit IDC connects the second input node IN2 and the output node OUT. Thus, the touch driving signal TDS output by the touch driving circuit TDC of the integrated driving circuit IDC can be output to the integrated pad IP through the output node OUT. Consequently, the touch driving signal TDS output to the integrated pad IP is delivered to the link line LL.

In addition, the touch driving signal TDS can be supplied to both the data line DL and the touch line TL electrically connected to the link line LL.

Referring to FIG. 8, during a touch mode period, a second pulse signal PS2 can be applied to the data line DL.

The second pulse signal PS2 applied to the data line DL during the touch mode period may correspond to the touch driving signal TDS applied to the touch electrode TE during the touch mode period. Thus, the phase of the second pulse signal PS2 applied to the data line DL during the touch mode period may be identical to the phase of the touch driving signal TDS applied to the touch electrode TE during the touch mode period.

In addition, during the touch mode period, the amplitude of the second pulse signal PS2 applied to the data line DL may be identical to the amplitude of the touch driving signal TDS applied to the touch electrode TE during the touch mode period.

Thus, during the touch mode period, a difference in voltage between the touch electrode TE and the data line DL or between the touch line TL and the data line DL can be removed or reduced, thereby preventing or reducing parasitic capacitance between the touch electrode TE and the data line DL or between the touch line TL and the data line DL.

Consequently, resistive capacitance (RC) delay on the touch electrode TE or the touch line TL is reduced, whereby the accuracy of touch sensing (touch performance) can be improved.

Application of a signal identical or similar to the touch driving signal TDS to the data line DL when the touch driving signal is applied to the touch electrode TE to remove or reduce parasitic capacitance between the touch electrode TE and the data line DL or between the touch line TL and the data line DL is referred to as load-free driving.

The display panel 110 may have an electrode disposed thereon, the electrode being spaced apart from the touch electrode TE such that an insulating layer is disposed therebetween.

During the display mode period, due to the first pulse signal PS1 being applied to the touch electrode TE, the voltage of the electrode spaced apart from the touch electrode TE with the insulating layer being disposed therebetween fluctuates like the first pulse signal PS1. In other words, during the display mode period, the voltage of the electrode spaced apart from the touch electrode TE can swing up and down in response to the first pulse signal PS1.

More specifically, during the display mode period, in response to the first pulse signal PS1 being applied to the touch line TL and the touch electrode TE that are used in touch driving, the status of a voltage applied to an electrode, which is able to form capacitance with the touch electrode TE, is similar to the status of the first pulse signal PS1.

For example, during the display mode period, when a voltage to be applied to the electrode spaced apart from the touch electrode TE is a direct current (DC) voltage, in response to the first pulse signal PS1 being applied to the touch electrode TE, the DC voltage applied to the electrode spaced apart from the touch electrode TE fluctuates in the same manner as the signal waveform (i.e. alternative current (AC) waveform) of the first pulse signal PS1.

As described above, due to integrated driving, during the display mode period, the status of a voltage to be applied to the electrode spaced apart from the touch electrode TE is different from its intended or desired voltage. This may cause an adverse effect on display performance.

However, in the case in which the voltage to be applied to the electrode spaced apart from the touch electrode TE is a ground voltage, during the display mode period, when the first pulse signal PS1 applied to the touch electrode TE causes the level of the ground voltage to fluctuate like an AC signal instead of having a predetermined voltage value, all signals in the display panel 110 may fluctuate. At this time, differences in voltage level among all signals may be maintained.

Thus, considering that display driving is performed based on differences in voltage level rather than absolute values of voltages, even in the case in which all signals fluctuate, differences in voltages among the signals are maintained, thereby having no effect on display performance.

In the case in which the display device 100 having a built-in touchscreen according to exemplary embodiments is an organic light-emitting display device, the display panel 110 includes a first electrode E1 (see FIG. 17), an organic light-emitting layer L11 (see FIG. 21) disposed on the first electrode E1, and a second electrode E2 (see FIG. 17) disposed on the organic light-emitting layer L11.

For example, the insulating layer disposed between the touch electrode TE and the electrode spaced apart from the touch electrode TE may be an encapsulation layer L14 (see FIG. 21), while the electrode spaced apart from the touch electrode TE may correspond to a second electrode of two electrodes (i.e. first and second electrodes) of an organic light-emitting diode (OLED).

In this case, when the second electrode is a cathode, during the display mode period, when the level of a base voltage EVSS (see FIG. 17) applied to the cathode fluctuates like an AC signal instead of having a predetermined voltage value due to the first pulse signal PS1 applied to the touch electrode TE, the level of the ground voltage fluctuates. Thus, all signals in the display panel 110 fluctuate, such that differences in voltages among the signals are maintained to be the same, thereby having no effect on display performance.

In addition, the touch line TL and the data line DL may be located on different layers.

In addition, the touch line TL and the data line DL may be electrically connected to each other in the peripheral area, the pad area, or an area of the display panel 110 in which the integrated driving circuit IDC is connected to the display panel 110.

Figure 21:
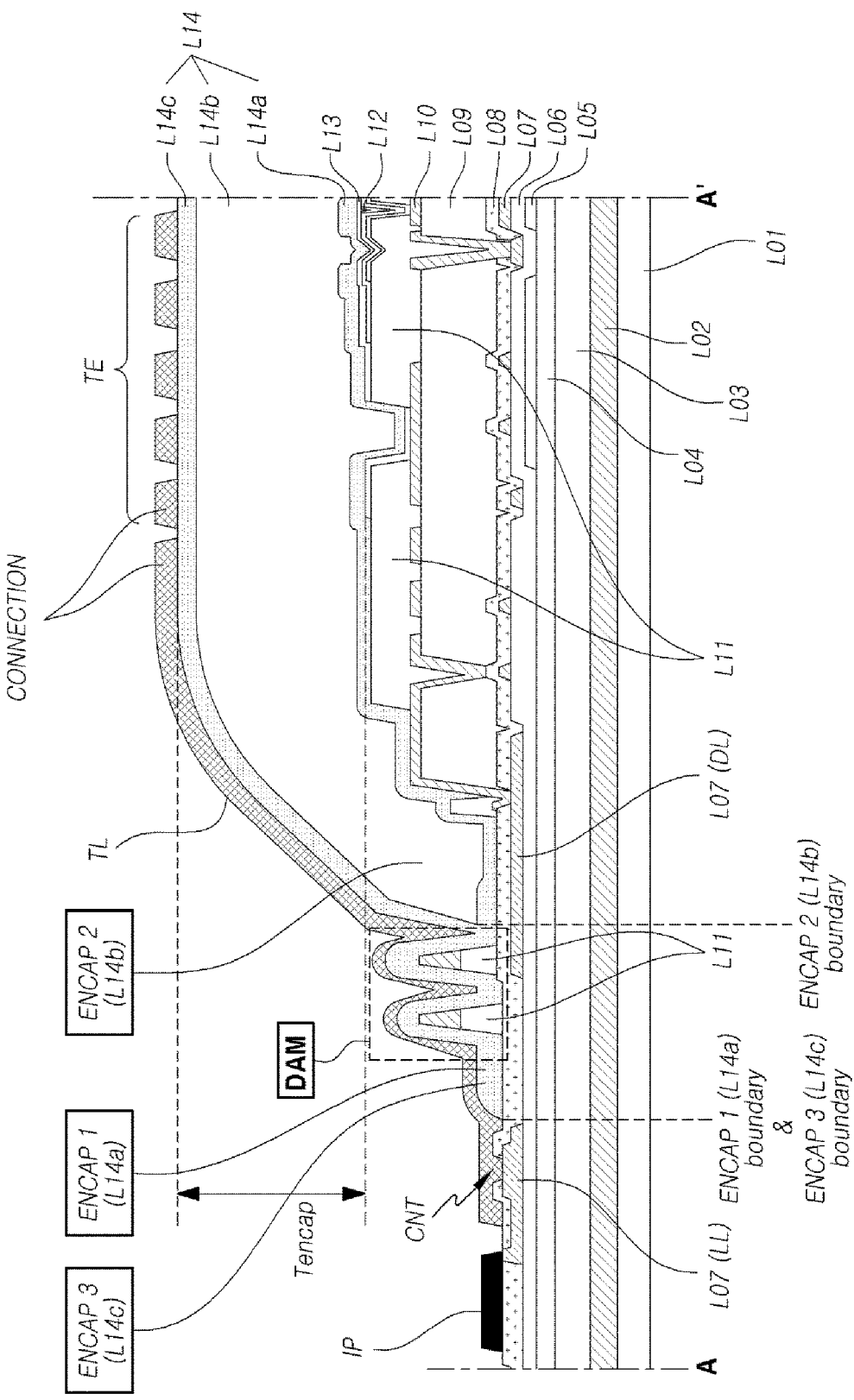

The touch line TL can be electrically connected to the data line DL at a location outside of a dam or a partition (see FIG. 21). The dam (DAM) or partition is located just outside of and adjacent to the boundary of the encapsulation layer L14 of the display panel 110. Alternatively, in other embodiments the dam or partition can be located at an edge region of the encapsulation layer L14 that is just inside of and adjacent to the boundary of the encapsulation layer.

Since the touch line TL and the data line DL are connected as described above, it is not necessary to change the design of the active area (or display area) of the display panel 110 to have a more complicated structure, thereby realizing integrated driving without a significant change in the design of the panel.

When the above-described display panel 110 having a built-in touchscreen according to exemplary embodiments is described briefly, the display panel 110 having a built-in touchscreen includes an integrated pad IP electrically connected to an integrated driving circuit IDC, a data line DL electrically connected to the integrated pad IP, a touch line TL electrically connected to the integrated pad IP, and a touch electrode TE connected to the touch line TL.

In the display panel 110 having a built-in touchscreen according to exemplary embodiments, the data line DL and the touch line TL can be electrically connected.

Hereinafter, several implementations of the display panel 110 having a built-in touchscreen according to exemplary embodiments will be described.

Figure 9:
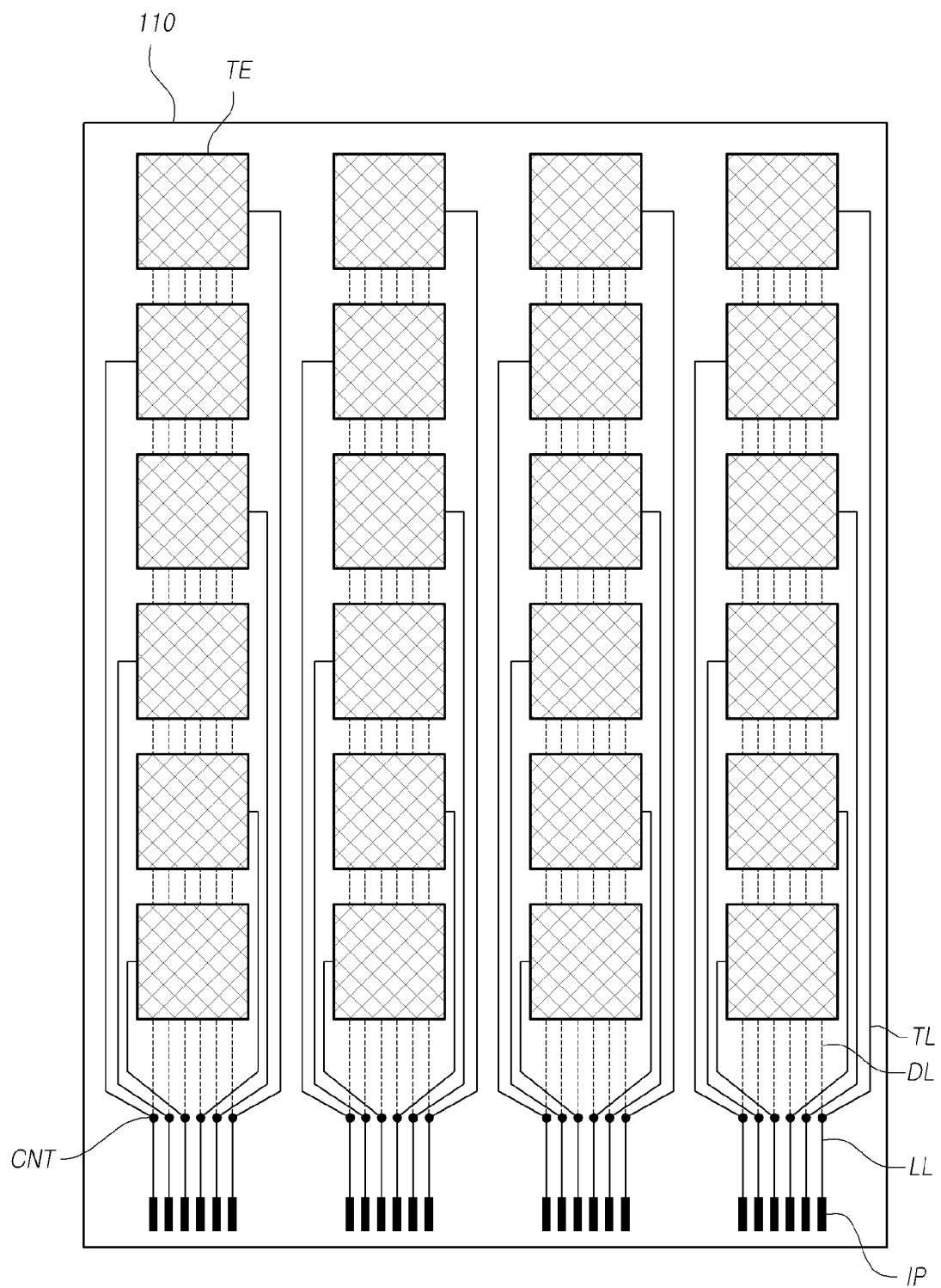
FIG. 9 and FIG. 10 are schematic views illustrating an implementation of the display panel having a built-in touchscreen according to exemplary embodiments, the display panel being able to perform integrated driving.
Figure 10:
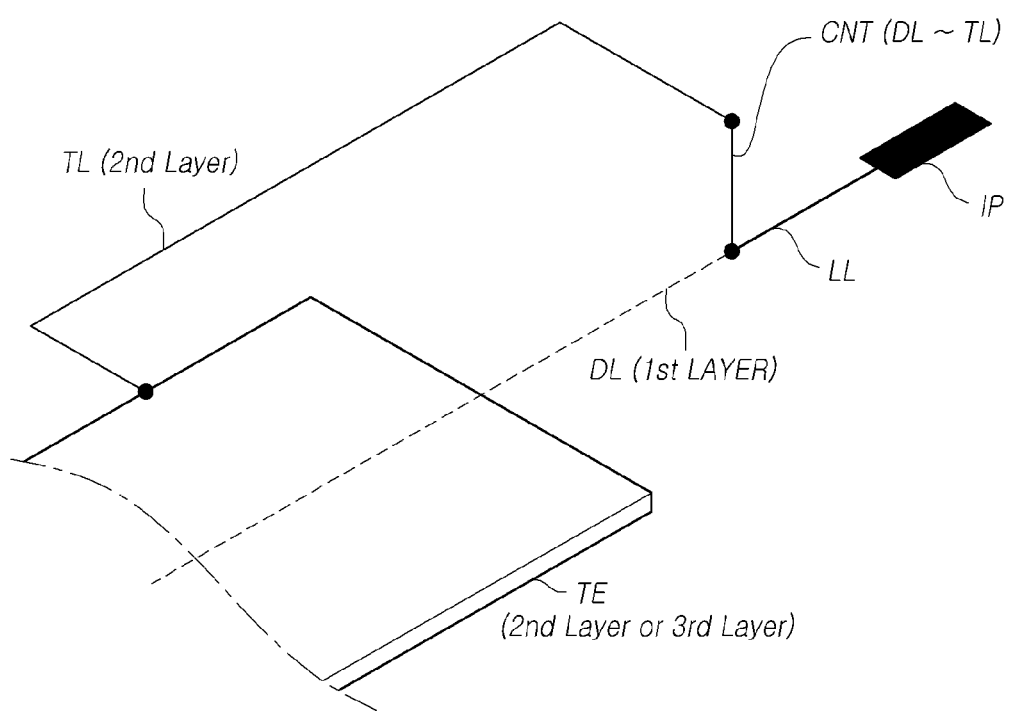

FIG. 9 and FIG. 10 are schematic views illustrating an implementation of the display panel 110 having a built-in touchscreen according to exemplary embodiments, the display panel being able to perform integrated driving.

Referring to FIG. 9, touch lines TL are connected to data lines DL in a corresponding manner.

In addition, one end of each of the touch lines TL is connected to a corresponding touch electrode TE, and the other end of each of the touch lines TL is connected to a corresponding data line DL or a link line LL connected to the data line DL.

According to the implementation illustrated in FIG. 9, the touch lines TL are located in an area in which the touch electrodes TE are absent. That is, the touch lines TL do not overlap the touch electrodes TE.

Since the touch lines TL are located in the area in which the touch electrodes TE are absent as described above, the layer on which the touch lines TL are formed is independent of the layer on which the touch electrodes TE are formed, thereby being able to increase the degree of freedom in the design of the panel.

Referring to FIG. 10, when a data line DL connected to an integrated pad IP through a link line LL is located on a first layer, a touch line TL is located on a second layer different from the first layer and is connected to the link line LL or the data line DL through a contact hole CNT.

The touch line TL can bypass any areas in which the touch electrodes TE are provided in order to be connected to a corresponding touch electrode TE.

Here, the touch electrode TE may be formed on the second layer on which the touch line TL is located or may be formed on a third layer different from the second layer.

When the touch lines TL are disposed in an area in which the touch electrodes TE are absent, the touch lines TL and the touch electrodes TE may be formed to be located on the same layer (e.g. the second layer in FIG. 10). In this case, it is possible to form the touch lines TL and the touch electrodes TE using only a single layer, thereby facilitating panel processing and reducing the thickness of the panel.

Alternatively, when the touch lines TL are disposed in an area in which the touch electrodes TE are absent, the touch lines TL and the touch electrodes TE may be formed to be located on different layers. This can consequently reduce the possibility of short circuit occurring between any of the touch lines TL and any of the touch electrode TE that should be electrically isolated from each other.

Figure 11:
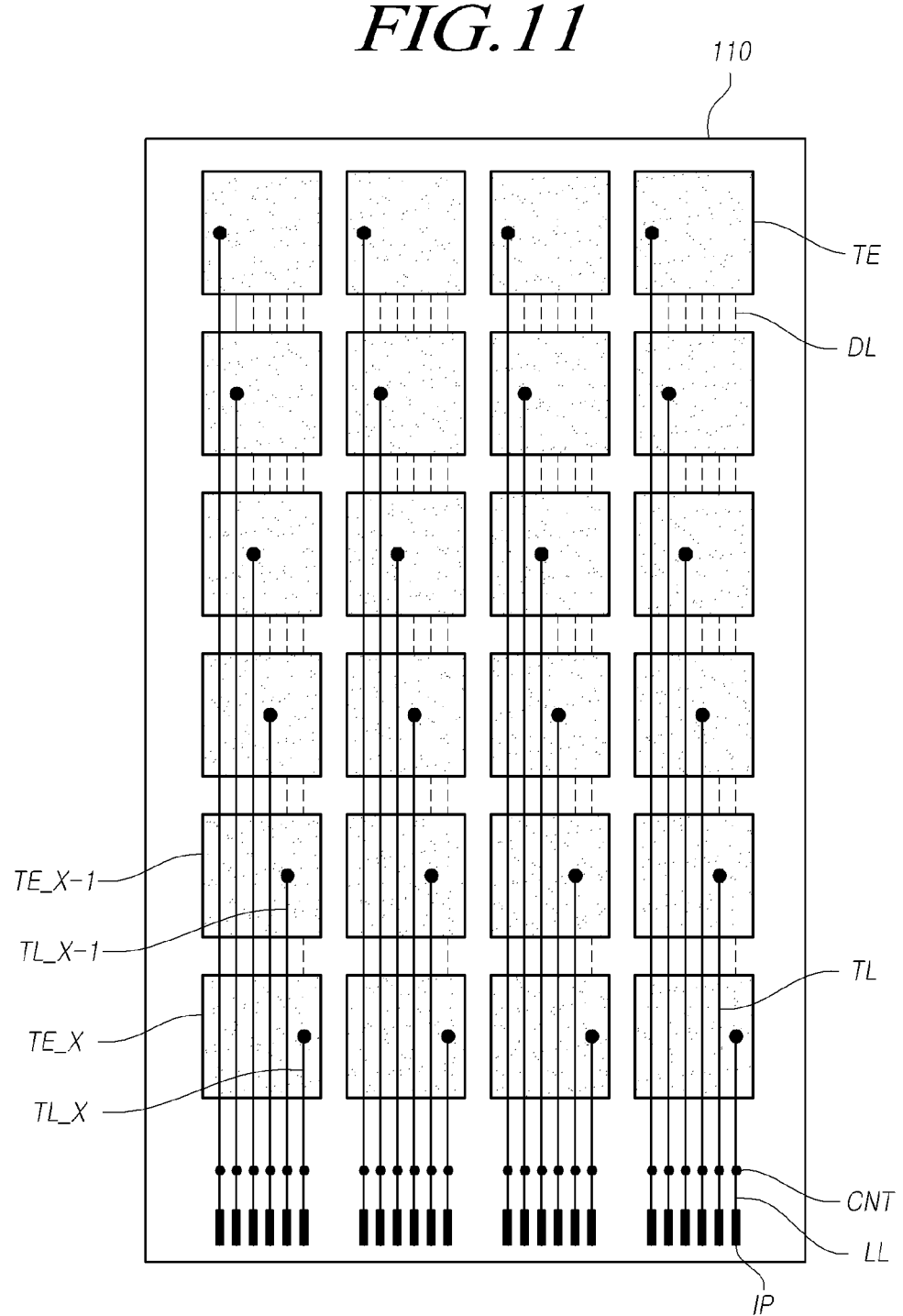
FIG. 11 and FIG. 12 are schematic views illustrating another implementation of the display panel having a built-in touchscreen according to exemplary embodiments, the display panel being able to perform integrated driving.
Figure 12:
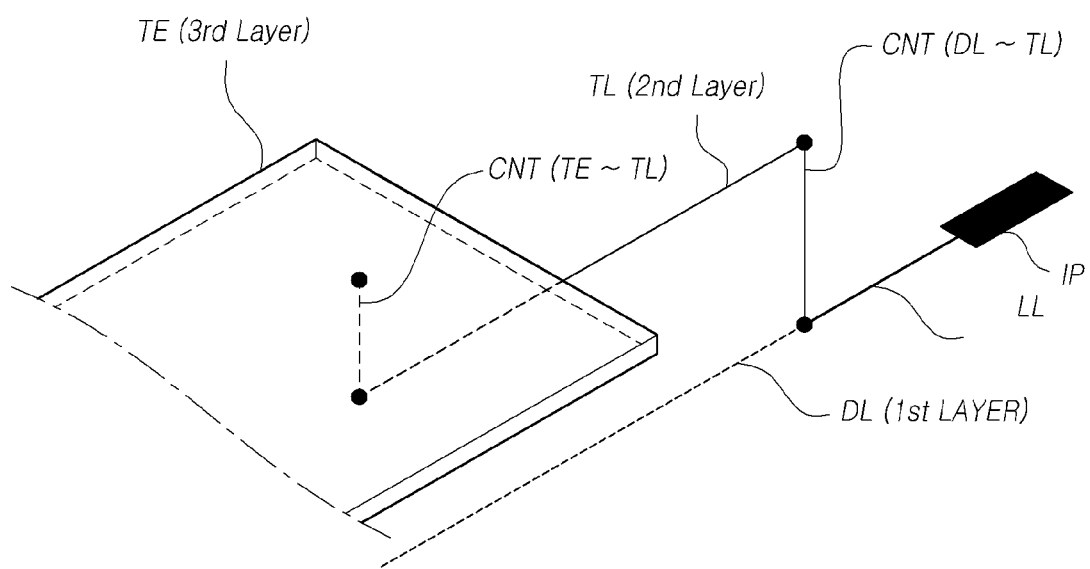

FIG. 11 and FIG. 12 are schematic views illustrating another implementation of the display panel 110 having a built-in touchscreen according to exemplary embodiments, the display panel being able to perform integrated driving.

Referring to FIG. 11, at least a portion of each of touch lines TL overlaps at least one touch electrode TE among a number of touch electrodes TE.

Predetermined portions of touch lines TL_X connected to touch electrodes TE_X closest to integrated pads IP overlap touch electrodes TE to which the touch lines TL_X are electrically connected.

Each of touch lines, e.g. TL_X−1, connected to touch electrodes, e.g. TE_X−1, overlaps a touch electrode, e.g. TE_X−1, electrically connected thereto while overlapping at least one touch electrode, e.g. TE_X, not electrically connected thereto. The exception is the touch line TL_X, which is connected to the touch electrode TE_X but does not overlap with any other touch electrode.

As described above, the touch lines TL are designed such that a portion of each touch lines overlaps at least one touch electrode TE among the number of touch electrodes TE. This can consequently reduce the area in which the touch electrodes TE are absent, thereby reducing the bezel area of the display panel 110.

Since each touch line TL overlaps at least one touch electrode TE, the touch lines TL and the touch electrodes TE may be designed to be located on different layers.

This configuration can reduce the possibility of short circuit occurring between a touch line, e.g. TL_X−1, and a touch electrode, e.g. TE_X, that should be electrically isolated from each other.

Figure 13:
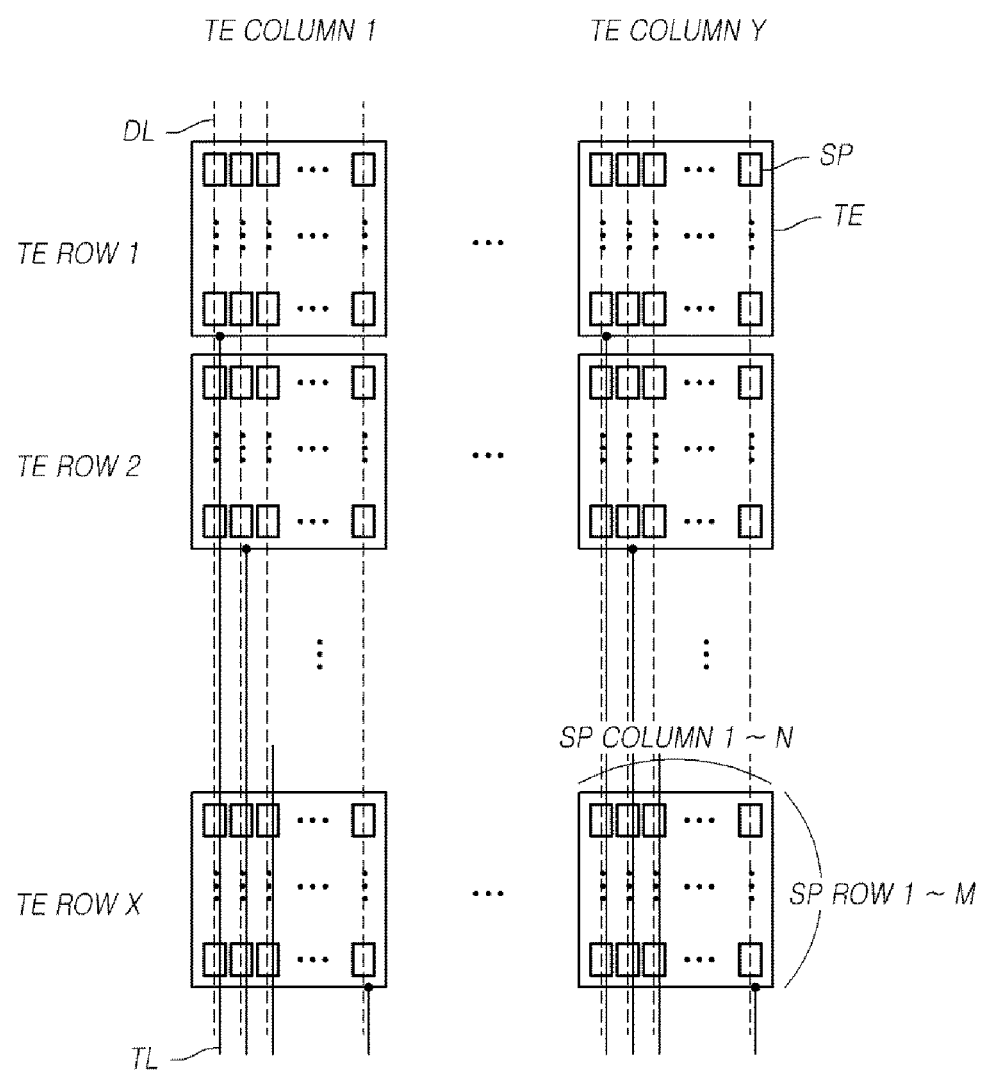
FIG. 13 is a schematic view illustrating the arrangement characteristics of touch electrodes and subpixels in the display panel having a built-in touchscreen according to exemplary embodiments, the display panel being able to perform integrated driving.

FIG. 13 is a schematic view illustrating the arrangement characteristics of touch electrodes TE and subpixels SP in the display panel 110 having a built-in touchscreen according to exemplary embodiments, the display panel being able to perform integrated driving.

Referring to FIG. 13, the touch electrodes TE are arranged in the form of a matrix comprised of X number of rows and Y number of columns, and areas in which the touch electrodes TE are located may overlap areas in which subpixels SP comprised of M number of rows and N number of columns are located.

Here, one of X and Y is a natural number equal to or greater than 1, and the other of X and Y is a natural number equal to or greater than 2, while M and N are natural numbers equal to or greater than 1.

The number of touch lines and the number of data lines is the same so that complete integrated driving of data driving and touch driving can be performed.

X indicates the number of touch electrodes in a single touch electrode column, and also corresponds to the number of touch lines in the single touch electrode column. N indicates the number of subpixel columns in a single touch electrode area, corresponding to the number of data lines passing through the single touch electrode area.

Thus, X and N can be the same values so that complete integrated driving of data driving and touch driving can be performed.

N corresponding to the number of data lines may be greater than X corresponding to the number of touch lines (i.e. the number of touch electrodes in a single touch electrode column) depending on changes in the design of the panel.

Thus N is equal to or greater than X.

As described above, the touch electrodes TE, the data lines DL, the touch lines TL, and so on are designed such that the number of touch electrodes X in a single touch electrode column and the number of subpixel rows N in a single touch electrode area are the same values, whereby complete integrated driving can be performed in a connection structure in which all of the data lines DL are connected to all of the touch lines TL in a corresponding manner. Thus, load-free driving can be performed on all of the data lines DL, while the number of pads can be minimized.

Figure 14:
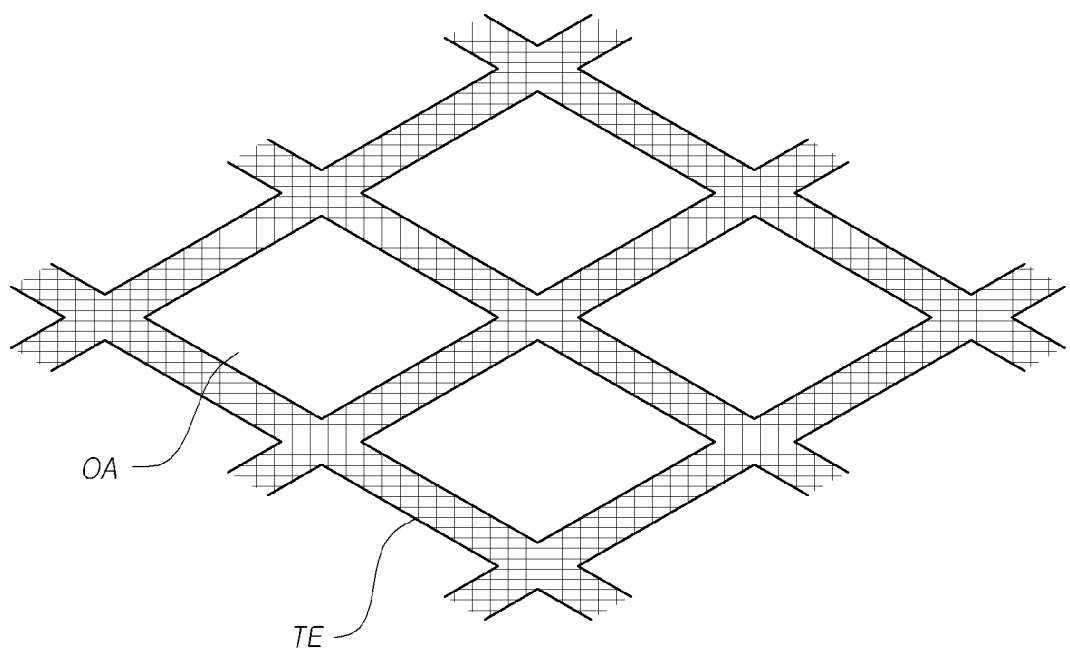
FIG. 14 and FIG. 15 are views illustrating a mesh-type touch electrode in the display panel having a built-in touchscreen according to exemplary embodiments.
Figure 15:
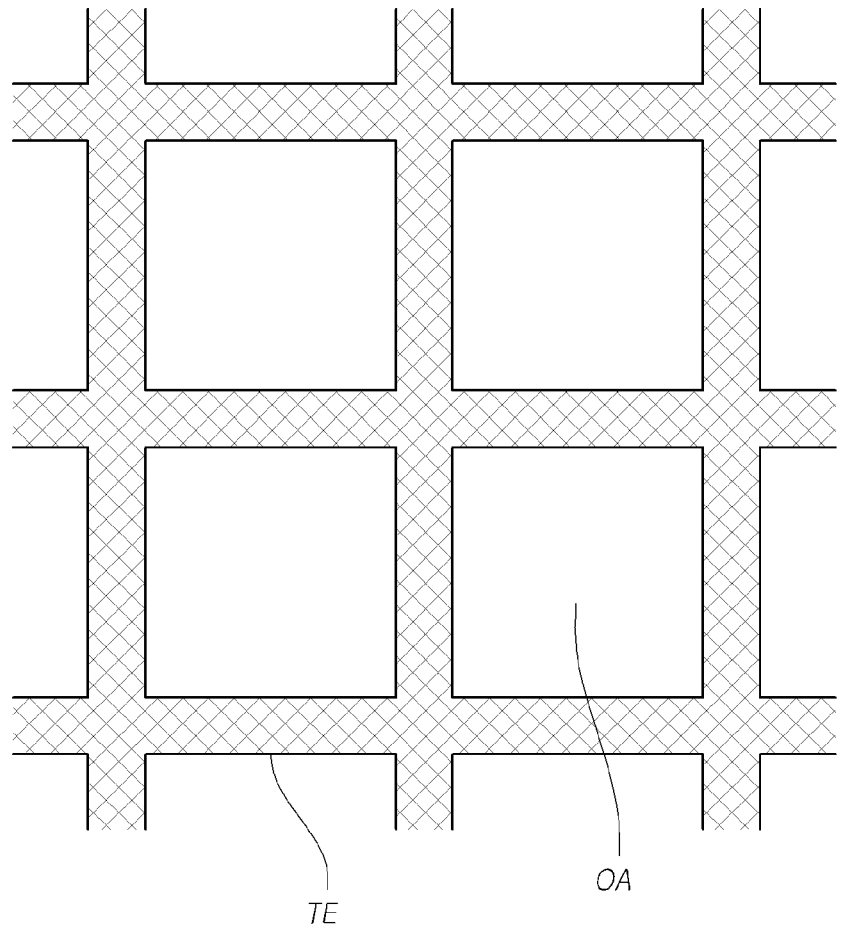

FIG. 14 and FIG. 15 are views illustrating a mesh shaped touch electrode TE in the display panel 110 having a built-in touchscreen according to exemplary embodiments.

FIG. 14 and FIG. 15 illustrate a portion of a single mesh shaped touch electrode TE.

Referring to FIG. 14 and FIG. 15, each touch electrode TE may be a mesh shaped electrode. The mesh shaped electrode has a mesh shaped pattern with one or more open areas OA, also referred to as openings.

When the touch electrode TE are mesh shaped touch electrodes as described above, the touch electrodes TE can be advantageously formed to be opaque electrodes.

When the touch electrodes TE are formed as mesh shaped touch electrodes, the open areas correspond to light-emitting areas of the subpixels, respectively. That is, first electrodes E1 of the subpixels may be located in the open areas OA, respectively.

As described above, the touch electrodes TE for touch sensing can be arranged on the display panel 110 without lowering the light-emitting efficiency of each subpixel.

As illustrated in FIG. 14 and FIG. 15, the open areas OA of the mesh shaped touch electrode TE may have the shape of a diamond or a rectangle depending on the shape of the arrangement of the subpixels.

Figure 16:
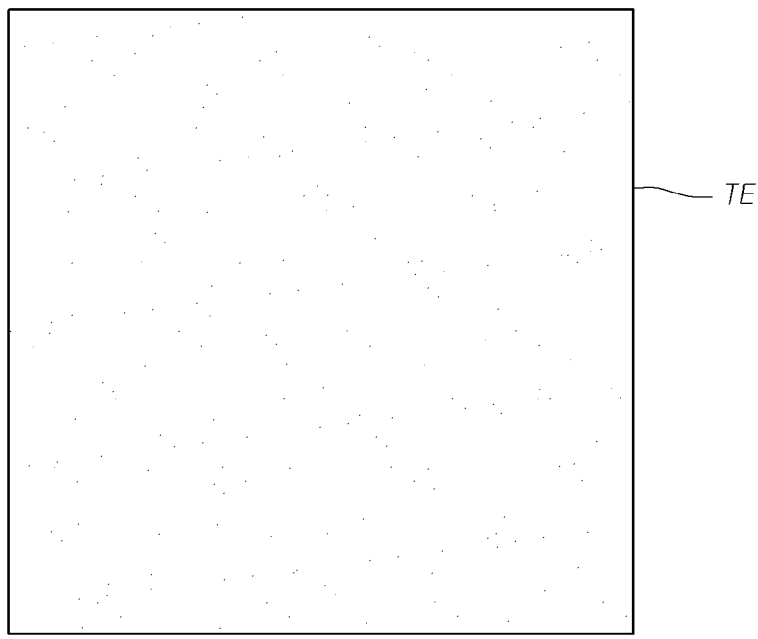
FIG. 16 is a view illustrating a bulk-type touch electrode in the display panel having a built-in touchscreen according to exemplary embodiments.

FIG. 16 is a view illustrating a bulk-type touch electrode TE in the display panel 110 having a built-in touchscreen according to exemplary embodiments.

Referring to FIG. 16, each touch electrode TE may be a bulk-type electrode without any open areas OA (see FIG. 15 and FIG. 16).

When the bulk-type touch electrodes TE without an open area OA are formed on the display panel 110 as described above, the formation of the touch electrodes on the display panel 110 may be facilitated.

When the touch electrodes TE are bulk-type electrodes, the touch electrodes TE may be transparent electrodes.

When the bulk-type touch electrodes TE are implemented as transparent electrodes as described above, the problem related to light emission in subpixel areas can be prevented.

The display device 100 having a built-in touchscreen according to exemplary embodiments may be one of a range of display devices, such as a liquid crystal display (LCD) device and an organic light-emitting display device.

Figure 17:
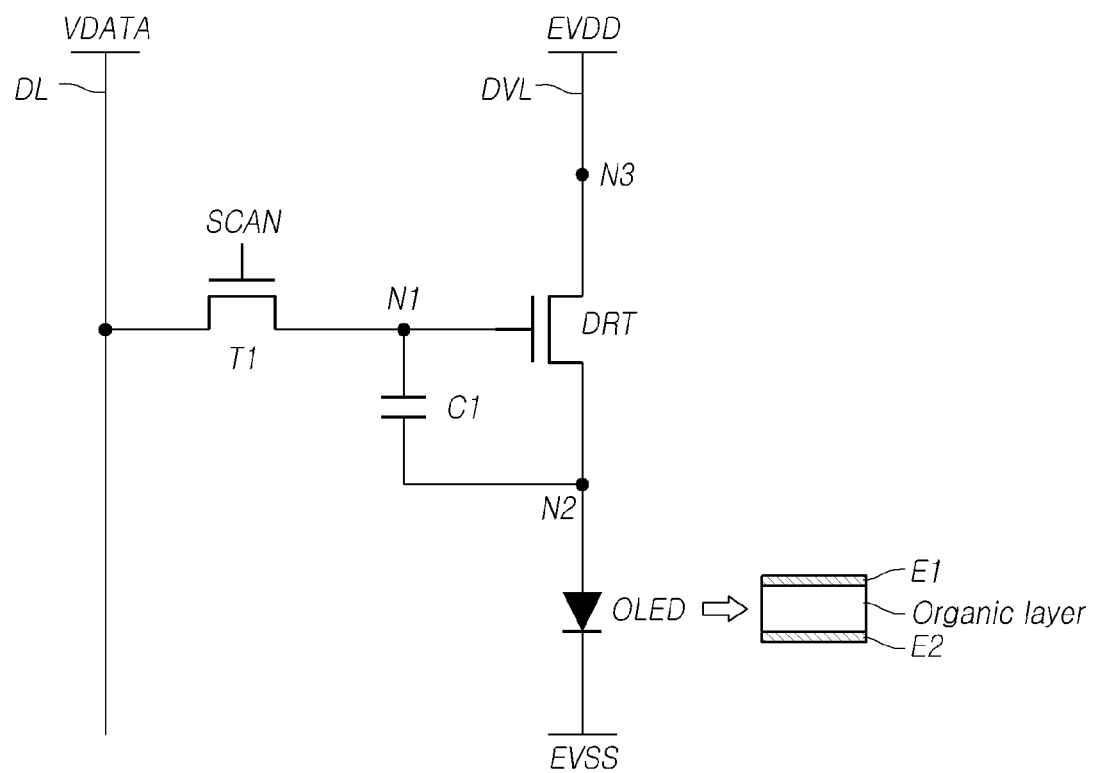
FIG. 17 and FIG. 18 are schematic views illustrating implementations of subpixel structures when the display panel having a built-in touchscreen according to exemplary embodiments is an organic light-emitting display panel.
Figure 18:
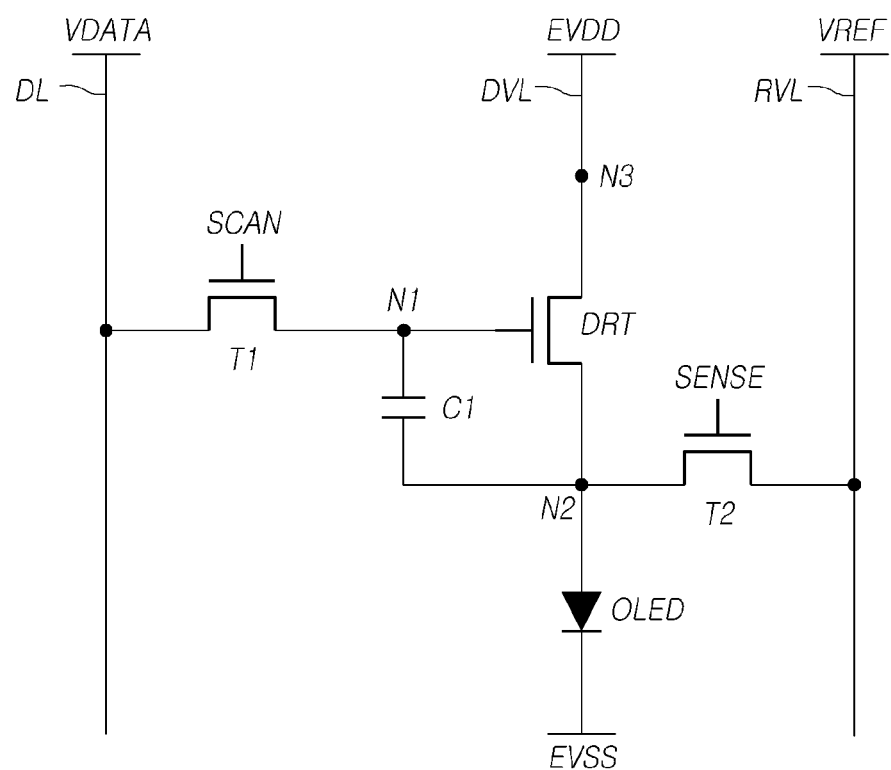

FIG. 17 and FIG. 18 are schematic views illustrating implementations of subpixel structures when the display panel 110 having a built-in touchscreen according to exemplary embodiments is an organic light-emitting display panel.

Referring to FIG. 17, in the display device 100 having a built-in touchscreen according to exemplary embodiments, each subpixel SP basically includes: an organic light-emitting diode OLED; a driving transistor DRT driving the organic light-emitting diode OLED; a first transistor T1 delivering a data voltage VDATA to a first node N1 corresponding to the gate node of the driving transistor DRT; and a storage capacitor C1 maintaining the data voltage VDATA corresponding to an image signal voltage or a voltage corresponding to the data voltage VDATA for a period of a single frame.

The organic light-emitting diode OLED includes a first electrode E1 (i.e. an anode or a cathode), an organic light-emitting layer, and a second electrode E2 (a cathode or an anode).

For example, a base voltage EVSS is applied to the second electrode E2 of the organic light-emitting diode OLED.

The driving transistor DRT drives the organic light-emitting diode OLED by supplying driving current to the organic light-emitting diode OLED.

The driving transistor DRT includes a first node N1, a second node N2, and a third node N3.

The first node N1 of the driving transistor DRT corresponds to the gate node, and is electrically connected to the source node or the drain node of the first transistor T1.

The second node N2 of the driving transistor DRT is electrically connected to the first electrode E1 of the organic light-emitting diode OLED, and is the source node or the drain node.

The third node N3 of the driving transistor DRT is a node to which a driving voltage EVDD is applied. The third node N3 is electrically connected to a driving voltage line DVL through which the driving voltage EVDD is supplied, and is the drain node or the source node.

The driving transistor DRT and the first transistor T1 may be implemented as n-type transistors or p-type transistors.

The first transistor T1 is electrically connected between a data line DL and the first node N1 of the driving transistor DRT, and can be controlled in response to a scanning signal SCAN applied to the gate node thereof through a gate line.

The first transistor T1 as described above is turned on by the scanning signal SCAN to deliver the data voltage VDATA supplied from the data line DL to the first node N1 of the driving transistor DRT.

The storage capacitor C1 can be electrically connected between the first node N1 and the second node N2 of the driving transistor DRT.

The storage capacitor C1 as described above is not a parasitic capacitor (e.g. Cgs or Cgd), i.e. an internal capacitor located between the first node N1 and the second node N2 of the driving transistor DRT, but is an external capacitor intentionally designed outside of the driving transistor DRT.

Referring to FIG. 18, each of the subpixels of the organic light-emitting panel according to exemplary embodiments, further includes a second transistor T2 in addition to the organic light-emitting diode OLED, the driving transistor DRT, and the first transistor T1.

Referring to FIG. 18, the second transistor T2 is electrically connected between the second node N2 of the driving transistor DRT and a reference voltage line RVL through which a reference voltage VREF is supplied. The second transistor T2 can be controlled in response to a sensing signal SENSE, i.e. a type of a scanning signal, being applied to the gate node thereof.

Since the second transistor T2 is further provided, it is possible to effectively control the voltage status of the second node N2 of the driving transistor DRT in the subpixel SP.

The second transistor T2 as described above is turned on by the sensing signal SENSE to apply the reference voltage VREF supplied through the reference voltage line RVL to the second node N2 of the driving transistor DRT.

The subpixel structure illustrated in FIG. 18 is advantageous in accurately initializing the voltage of the second node N2 of the driving transistor DRT and sensing the unique characteristics (e.g. the threshold voltage or mobility) of the driving transistor DRT and the unique characteristics (e.g. the threshold voltage) of the organic light-emitting diode OLED.

The scanning signal SCAN and the sensing signal SENSE may be separate gate signals. In this case, the scanning signal SCAN and the sensing signal SENSE can be applied to the gate node of the first transistor T1 and the gate node of the second transistor T2 through different gate lines, respectively.

In some cases, the scanning signal SCAN and the sensing signal SENSE may be the same signal. In this case, the scanning signal SCAN and the sensing signal SENSE may be applied commonly to the gate node of the first transistor T1 and the gate node of the second transistor T2 through the same gate line.

Hereinafter, a structure of disposing a touchscreen within an organic light-emitting display panel having the above-described subpixel structure, as well as an integrated driving method, an integrated driving circuit, and a signal connection structure based on the structure of disposing a touchscreen within an organic light-emitting display panel, will be described.

When the organic light-emitting display panel 110 having a built-in touchscreen includes a first electrode E1, an organic light-emitting layer located on the first electrode E1, and a second electrode E2 located on the organic light-emitting layer, an encapsulation layer may be disposed on the second electrode E2 to prevent the infiltration of moisture, air, and so on.

The touch electrodes TE and the touch lines TL may be disposed on the encapsulation layer.

The structure including the touch electrodes TE and the touch lines TL disposed on the encapsulation layer is referred to as a touch-on-encapsulation layer (TOE).

The use of the above-described TOE structure can realize the display panel 110 having a built-in touchscreen, the display panel 110 being able to provide a touch sensing function without interfering with a display function, and the display device 100 including the display panel 110 having a built-in touchscreen. A touchscreen can be disposed within (or built in) the display panel 110 without complicated panel fabrication processing.

In addition, in display device 100 having a built-in touchscreen according to exemplary embodiments, the data line DL connected to the source node or the drain node of the first transistor T1 is electrically connected to the touch electrode TE.

As described above, it is possible to perform integrated driving in the organic light-emitting display device 100 having a built-in touchscreen and reduce the number of the pads.

Hereinafter, the TOE structure of the display panel 110 having a built-in touchscreen according to exemplary embodiments, as well as an integrated driving method, an integrated driving circuit, and a signal connection structure based on the TOE structure, will be described in more detail.

Figure 19:
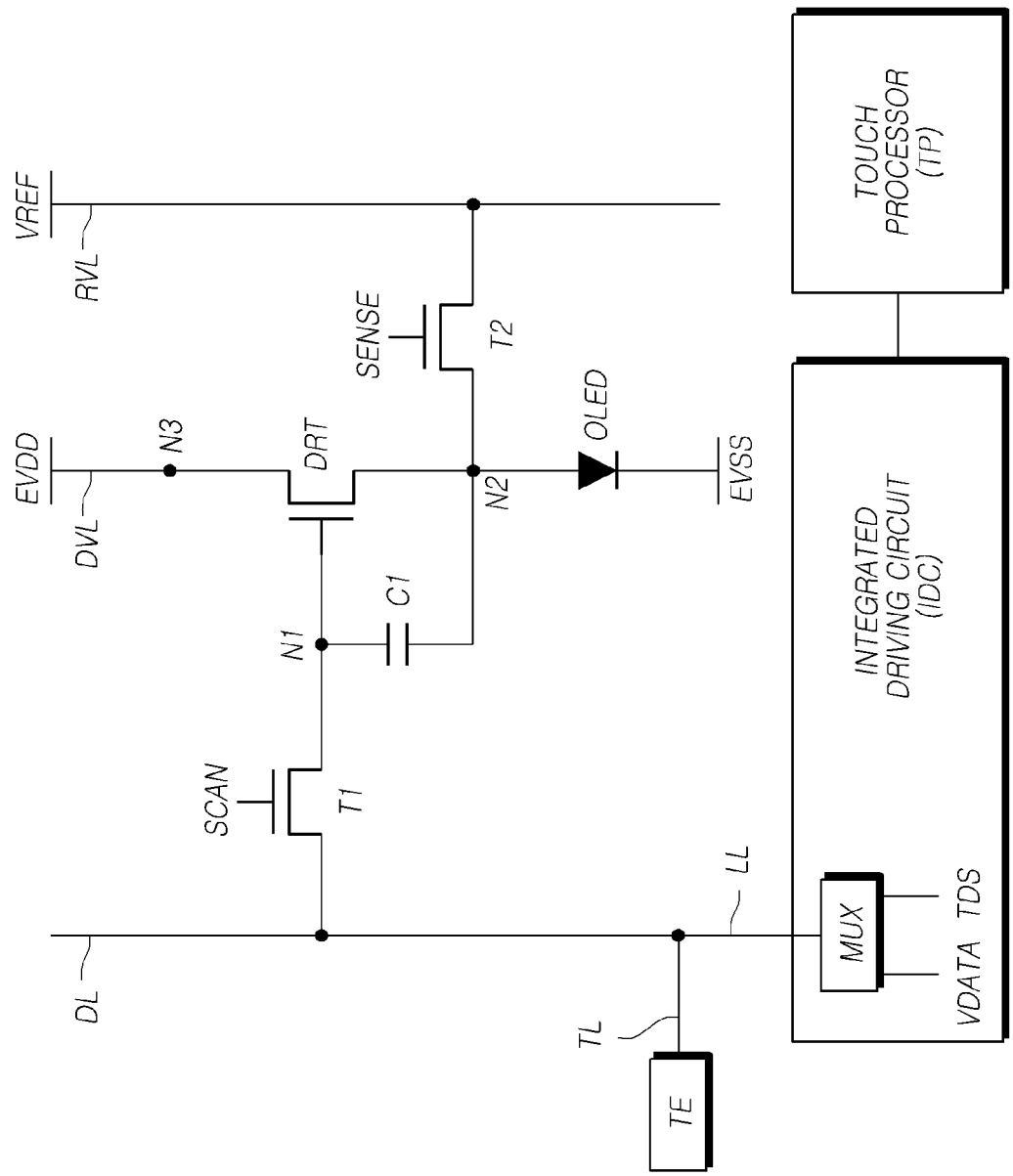
FIG. 19 is a schematic view illustrating an integrated driving system when the display device having a built-in touchscreen according to exemplary embodiments is an organic light-emitting display device.

FIG. 19 is a schematic view illustrating an integrated driving system when the display device 100 having a built-in touchscreen according to exemplary embodiments is an organic light-emitting display device. Here, a subpixel structure including three transistors DRT, T1, and T2 a single capacitor C1, as illustrated in FIG. 18, will be taken as an example.

Referring to FIG. 19, the drain node or the source node of the first transistor T1 in a single subpixel SP is electrically connected to a data line DL.

An integrated driving circuit IDC is commonly connected to the corresponding data line DL and a touch line TL through a corresponding link line LL.

During a display mode period, the integrated driving circuit IDC outputs a corresponding data voltage VDATA through a switch MUX.

The data voltage VDATA output by the integrated driving circuit IDC is applied to both the corresponding data line DL and the touch line TL.

Thus, the data voltage VDATA is applied to the first node N1 of the driving transistor DRT through the first transistor T1, and at the same time, is applied to the touch electrode TE through the touch line TL.

When data voltages are applied sequentially to several subpixels connected to data lines DL, a first pulse signal PS1 (in the form of a combination of data voltages that have been supplied sequentially) is applied to the touch electrode TE, and the level of a base voltage EVSS applied to the second electrode E2 of the organic light-emitting diode OLED fluctuates in the same pattern as the first pulse signal PS1.

During the touch mode period, the integrated driving circuit IDC outputs a corresponding touch driving signal through the switch MUX. The touch driving signal TDS output by the integrated driving circuit IDC is applied to both the corresponding data line DL and the touch line TL.

Thus, the touch driving signal TDS is applied to the touch electrode TE through the touch line TL, thereby enabling touch driving. In addition, the touch driving signal TDS is applied to the data line DL, thereby contributing to the removal of parasitic capacitance between the data line DL and the touch electrode TE.

As described above, in the organic light-emitting display panel 110 having a built-in touchscreen and based on the TOE touch structure (the touch electrodes and the touch lines), each of a number of subpixels includes the organic light-emitting diode OLED, the driving transistor DRT driving the organic light-emitting diode OLED, the first transistor electrically connected between the first node of the driving transistor DRT and the data line DL, and the storage capacitor C1 electrically connected between the first node and the second node of the driving transistor DRT.

The organic light-emitting diode OLED includes the first electrode E1 located in each subpixel area and electrically connected to the second node of the driving transistor DRT, the second electrode E2 present commonly in the entirety of subpixel areas such that a base voltage is applied thereto, and the organic light-emitting layer L11 (FIG. 21) disposed between the first electrode E1 and the second electrode E2.

The display panel 110 having a built-in touchscreen may further include an encapsulation layer located on the second electrode E2 and a number of touch lines TL on the encapsulation layer.

The touch electrodes TE may also be located on the encapsulation layer L14 (FIG. 21) and in direct contact with the encapsulation layer L14. The touch electrodes TE are electrically isolated from each other without overlapping each other.

The touch lines TL are electrically isolated from each other without overlapping each other.

That is, the display panel 110 having a built-in touchscreen has a self-capacitance based touch sensing structure.

The touch electrodes TE on the encapsulation layer may be electrically connected to the touch lines TL on the encapsulation layer in a corresponding manner.

As the display panel 110 having the touch electrodes TE and the touch lines TL is embodied according to the above-described TOE structure, the touch structure can be disposed within the display panel 110 without interfering with existing display-related components within the display panel 110.

In addition, as the display panel 110 having the touch electrodes TE and the touch lines TL is embodied according to the above-described TOE structure, it is possible to fabricate the display panel 110 having a built-in touchscreen and a self-capacitance based touch structure using a simple panel fabrication process.

As illustrated in FIG. 19, the touch lines TL are electrically connected to the data lines DL in a corresponding manner.

The above-described structure allows the organic light-emitting display device 100 having a built-in touchscreen to perform integrated driving and can significantly reduce the number of the pads in the display panel 110 and the integrated driving circuit IDC.

Figure 20:
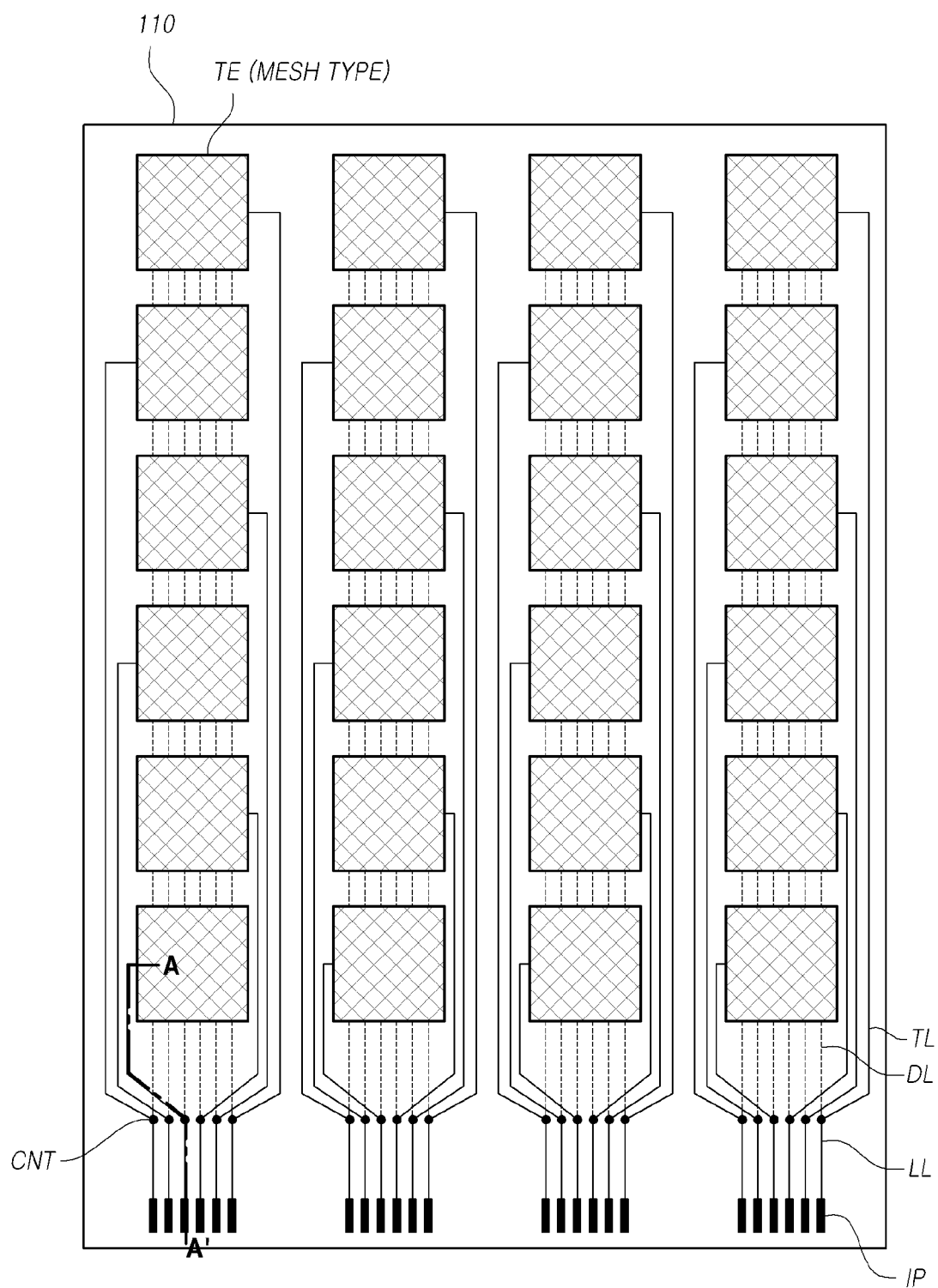
FIG. 20 and FIG. 21 are schematic views illustrating an implementation of the display panel having a built-in touchscreen when the display device having a built-in touchscreen according to exemplary embodiments is an organic light-emitting display device.

FIG. 20 and FIG. 21 are schematic views illustrating an implementation of the display panel 110 having a built-in touchscreen when the display device 100 having a built-in touchscreen according to exemplary embodiments is an organic light-emitting display device.

FIG. 20 and FIG. 21 illustrate an organic light-emitting display panel in which the implementation of the display panel 110 having a built-in touchscreen illustrated in FIG. 9 and FIG. 10 are embodied.

Referring to FIG. 20, touch lines TL are located in an area in which the touch electrodes TE are absent. Thus, the touch lines TL may be formed on the same layer as the touch electrodes TE or on a different layer from the touch electrodes TE.

The touch lines TL are electrically connected to data lines DL in the peripheral area (also referred to as a bezel area or pad regions) of the display panel 110 having a built-in touchscreen.

The cross-sectional structure of the display panel 110 having a built-in touchscreen (taken along line A-A' in FIG. 20) will be described with reference to FIG. 21.

A polyimide (PI) layer L02 is located on a substrate or a back plate L01.

A buffer layer L03 is located on the polyimide layer LI02, and an interlayer insulating film L04 is located on the buffer layer L03.

A gate layer L05 is located on the interlayer insulating film L04, and gate electrodes or the like may be formed in desired positions on the gate layer L05.

A gate insulating film L06 is located on the gate layer L05.

A source/drain layer L07 is located on the gate insulating film L06.

Signal lines, such as data lines DL and link lines GL, and the source/drain electrodes of a variety of transistors may be formed on the source/drain layer L07.

A protective layer L08 is located on the source/drain layer L07.

A planarization layer L09 is located on the protective layer L08, and a first electrode layer L10 is located on the planarization layer L09. The first electrode layer L10 has first electrodes E1 formed in light-emitting positions of subpixels.

A bank layer L11 is located on the first electrode layer L10, and an organic light-emitting layer L12 is located on the bank layer L11.

A second electrode layer L13 is located on the organic light-emitting layer L12. The second electrode layer L13 is formed commonly in the entirety of subpixel areas.

An encapsulation layer L14 for preventing the infiltration of moisture, air, and so on is located on the second electrode layer L13.

The encapsulation layer L14 may be a single layer or may be comprised of at least two layers stacked on each other.

In addition, the encapsulation layer L14 may be a metal layer or may have a multilayer structure in which at least two layers comprised of organic and inorganic layers are stacked on each other.

In the implementation illustrated in FIG. 21, the encapsulation layer L14 is a multilayer structure comprised of a first encapsulation layer L14a (ENCAP 1), a second encapsulation layer L14b (ENCAP 2), and a third encapsulation layer L14c (ENCAP 3).

Each of the first encapsulation layer L14a, the second encapsulation layer L14b, and the third encapsulation layer L14c may be an organic layer and/or an inorganic layer. For example, the first encapsulation layer L14a and the third encapsulation layer L14c may be an inorganic layer, and the second encapsulation layer L14b may be an organic layer.

An encapsulation dam DAM is provided on the peripheral portions of the panel. The encapsulation dam DAM prevents the material of the encapsulation layer L14 (which may be liquid, especially the second encapsulation layer L14b) from flowing out of the display. The encapsulation dam DAM can also prevent external moisture or oxygen from affecting the encapsulation layer L14. The DAM can also represent the boundary between the active area and non-active area of the display.

Touch electrodes TE are formed on the encapsulation layer L14.

In addition, touch lines TL are formed on the encapsulation layer L14.

The touch electrodes TE on the encapsulation layer L14 may be electrically connected to the touch lines TL on the encapsulation layer L14.

The touch lines TL, electrically connected to the touch electrodes TE on the encapsulation layer L14 in a corresponding manner, extend in an area in which the touch electrodes TE are absent such that the touch lines TL do not overlap the touch electrodes TE.

The touch lines TL extend beyond an area in which the dam DAM is located to reach an area outside of the dam DAM, i.e. an area adjacent to integrated pads IP.

In the area outside of the dam DAM, the touch lines TL are connected to the data lines DL or the link lines LL formed on the source/drain layer L07 through contact holes CNT.

The data lines DL or the link lines LL are electrically connected to the integrated pads IP located in the area outside of the dam DAM (i.e. in the non-display area of the display.)

While the touch lines TL and the touch electrodes TE are located on the encapsulation layer L14, the touch lines TL and the touch electrodes TE may be located on the same layer or different layers.

FIG. 21 illustrates an implementation of the display panel 110 in which touch lines TL and touch electrodes TE are located on the same layer.

In addition, in the implementation illustrated in FIG. 21, the touch electrodes TE are mesh shaped touch electrodes having open areas OA (FIG. 14 and FIG. 15).

Referring to FIG. 21, the encapsulation layer L14 has a predetermined thickness Tencap.

The thickness Tencap of the encapsulation layer L14 has an effect on RC delay and touch performance (touch sensitivity) during touch driving and touch sensing.

Thus, the thickness Tencap of the encapsulation layer L14 must be designed in consideration of RC delay and touch performance (touch sensitivity). This feature will be described later with reference to FIG. 28.

Figure 22:
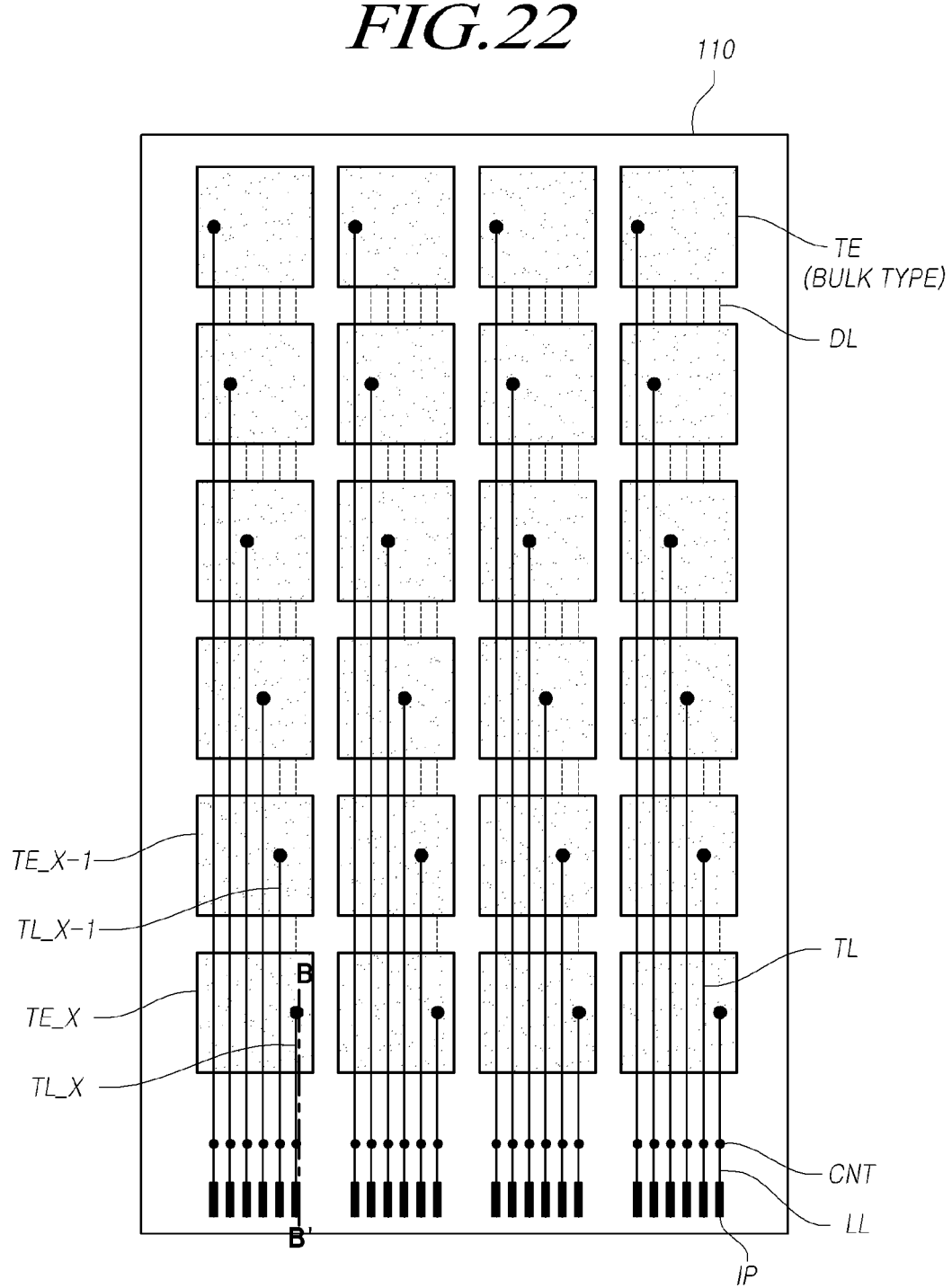
FIG. 22 and FIG. 23 are schematic views illustrating another implementation of the display panel having a built-in touchscreen when the display device having a built-in touchscreen according to exemplary embodiments is an organic light-emitting display device.
Figure 23:
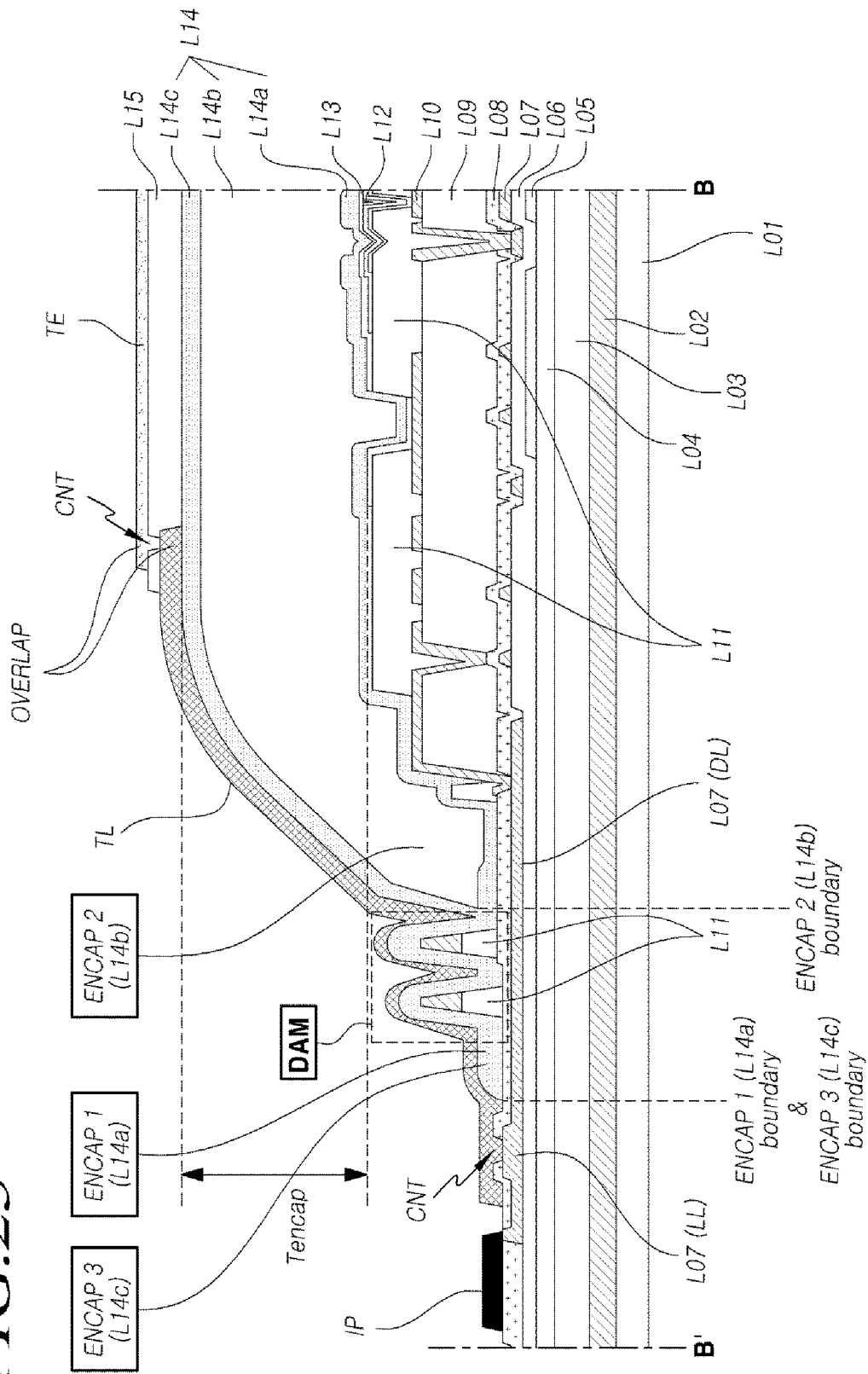

FIG. 22 and FIG. 23 are schematic views illustrating another implementation of the display panel 110 having a built-in touchscreen when the display device 100 having a built-in touchscreen according to exemplary embodiments is an organic light-emitting display device.

FIG. 22 and FIG. 23 illustrate an organic light-emitting display panel in which the implementation of the display panel 110 having a built-in touchscreen illustrated in FIG. 11 and FIG. 12 are embodied.

A polyimide layer LI02 is located on a substrate or a back plate L01.

A buffer layer L03 is located on the polyimide layer LI02, and an interlayer insulating film L04 is located on the buffer layer L03.

A gate layer L05 is located on the interlayer insulating film L04, and gate electrodes or the like may be formed in desired positions on the gate layer L05.

A gate insulating film L06 is located on the gate layer L05.

A source/drain layer L07 is located on the gate insulating film L06.

Signal lines, such as data lines DL and link lines GL, and the source/drain electrodes of a variety of transistors may be formed on the source/drain layer L07.

A protective layer L08 is located on the source/drain layer L07.

A planarization layer L09 is located on the protective layer L08, and a first electrode layer L10 is located on the planarization layer L09. The first electrode layer L10 has first electrodes E1 formed in light-emitting positions of subpixels.

A bank layer L11 is located on the first electrode layer L10, and an organic light-emitting layer L12 is located on the bank layer L11.

A second electrode layer L13 is located on the organic light-emitting layer L12. The second electrode layer L13 is formed commonly in the entirety of subpixel areas.

An encapsulation layer L14 for preventing the infiltration of moisture, air, and so on is located on the second electrode layer L13.

A dam DAM is provided on the peripheral portions of the panel.

The encapsulation layer L14 may be a single layer or may be comprised of at least two layers stacked on each other.

In addition, the encapsulation layer L14 may be a metal layer or may have a multilayer structure in which at least two layers comprised of organic and inorganic layers are stacked on each other.

In the implementation illustrated in FIG. 23, the encapsulation layer L14 is a multilayer structure comprised of a first encapsulation layer L14a (ENCAP 1), a second encapsulation layer L14b (ENCAP 2), and a third encapsulation layer L14c (ENCAP 3).

Each of the first encapsulation layer L14a, the second encapsulation layer L14b, and the third encapsulation layer L14c may be an organic layer and/or an inorganic layer. For example, the first encapsulation layer L14a and the third encapsulation layer L14c may be an inorganic layer, and the second encapsulation layer L14b may be an organic layer.

Touch electrodes TE are formed on the encapsulation layer L14.

In FIG. 22 and FIG. 23, the touch electrodes TE are bulk-type touch electrodes without open areas. In this case, the touch electrodes TE may be transparent electrodes.

In addition, touch lines TL are formed on the encapsulation layer L14.

Referring to FIG. 22, the touch lines TL are formed to partially overlap the touch electrodes TE.

Thus, the touch lines TL and the touch electrodes TE are formed on different layers.

For example, according to the implementation illustrated in FIG. 23, the touch lines TL are located on the encapsulation layer L14, the insulating layer L15 is located on the touch lines TL, and the touch electrodes TE are located on the insulating layer L15.

The touch lines TL are electrically connected to the corresponding touch electrodes TE through contact holes CNT.

The touch lines TL connected to the touch electrodes TE extend beyond an area in which the dam DAM is located to reach an area outside of the dam DAM, i.e. an area adjacent to integrated pads IP In the area outside of the dam DAM, the touch lines TL are connected to the data lines DL or the link lines LL formed on the source/drain layer L07 through contact holes CNT.

The data lines DL or the link lines LL are electrically connected to the integrated pads IP located in the area outside of the dam DAM.

Referring to FIG. 23, the encapsulation layer L14 has a predetermined thickness Tencap.

The thickness Tencap of the encapsulation layer L14 has an effect on RC delay and touch performance (touch sensitivity) during touch driving and touch sensing.

Thus, the thickness Tencap of the encapsulation layer L14 can be designed in consideration of RC delay and touch performance (touch sensitivity). This feature will be described later with reference to FIG. 28.

Figure 24:
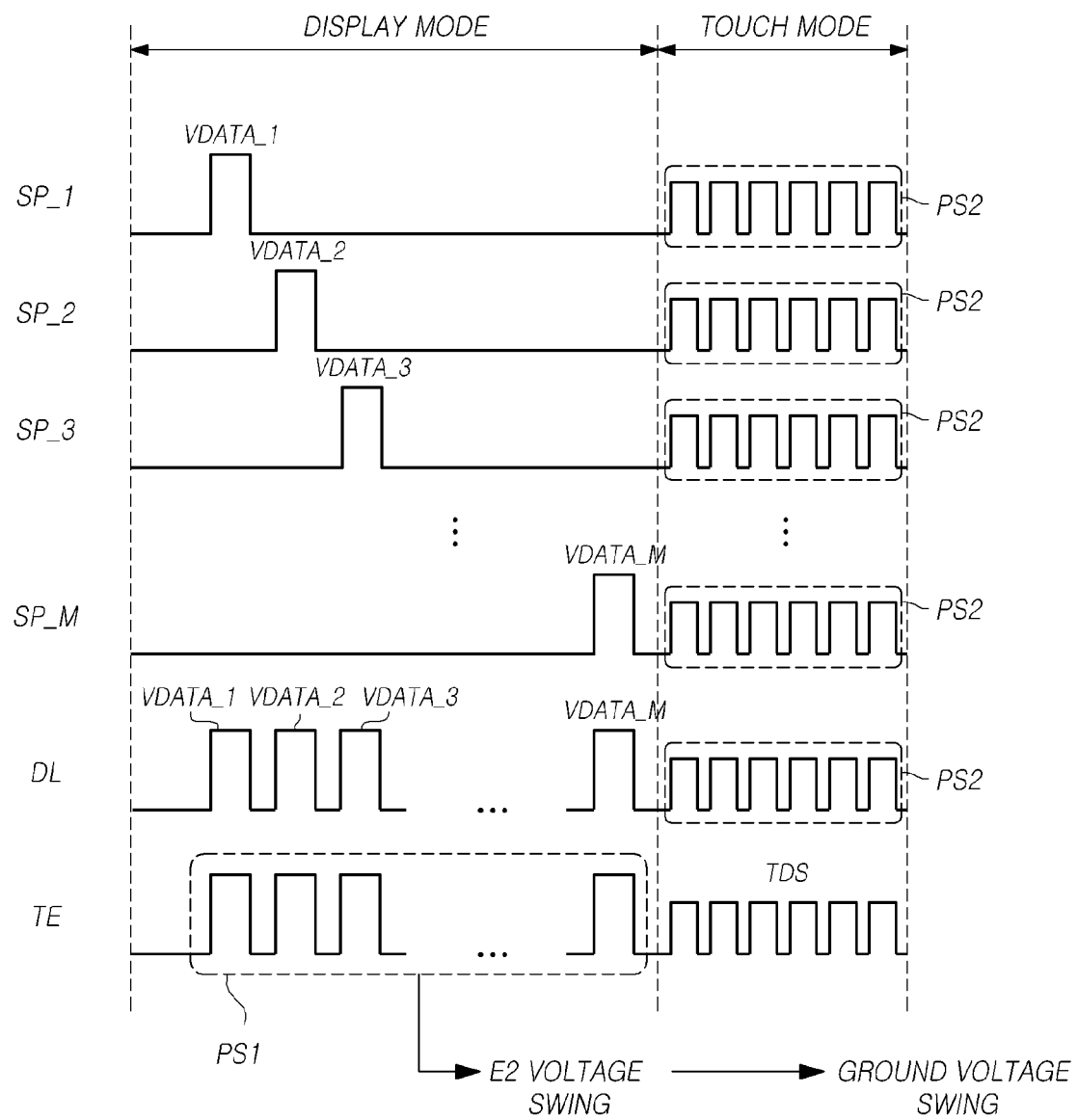
FIG. 24 is a schematic view illustrating signals applied to a data line and a touch electrode by integrated driving during a display mode period and a touch mode period when the display device having a built-in touchscreen according to exemplary embodiments is an organic light-emitting display device.

FIG. 24 is a schematic view illustrating signals applied to a data line DL and a touch electrode TE by integrated driving during a display mode period and a touch mode period when the display device 100 having a built-in touchscreen according to exemplary embodiments is an organic light-emitting display device.

FIG. 24 illustrates signals applied to M number of subpixels SP_1 to SP_M, a single data line DL commonly connected to the M number of subpixels SP_1 to SP_M, and a single touch electrode TE located in an area in which the M number of subpixels SP_1 to SP_M are located, respectively, in the structure illustrated in FIG. 6 when integrated driving of data driving and touch driving is performed.

Referring to FIG. 24, during the display mode period, when data voltages VDATA-1 to VDATA-M to be supplied to the M number of subpixels SP_1 to SP_M are supplied sequentially to the data line DL connected to the M number of subpixels SP_1 to SP_M, a first pulse signal PS1 can be applied to the touch line TL electrically connected to the data line DL.

The first pulse signal PS1 is a signal formed by combining the data voltages VDATA-1 to VDATA-M applied sequentially to the data line DL connected to the M number of subpixels SP_1 to SP_M.

As described above, during the display mode period, the first pulse signal PS1 comprised of one or two pulses formed by sequentially combining data voltages is applied to the touch line TL and the touch electrode TE used in touch driving.

Referring to FIG. 24, during a touch mode period, when a touch driving signal TDS is being applied to the touch electrode TE through the touch line TL, a second pulse signal PS2 can be applied to the data line DL electrically connected to the touch line TL.

The phase of the second pulse signal PS2 applied to the data line DL during touch mode period is identical to the phase of the touch driving signal TDS applied to the touch electrode TE during the touch mode period.

In addition, the phase of the second pulse signal PS2 applied to the data line DL during the touch mode period is identical to the phase of the touch driving signal TDS applied to the touch electrode TE during the touch mode period.

Thus, during the touch mode period, a difference in voltage between the touch electrode TE and the data line DL or between the touch line TL and the data line DL can be removed or reduced, thereby preventing or reducing parasitic capacitance between the touch electrode TE and the data line DL or between the touch line TL and the data line DL. Consequently, touch performance (touch sensitivity) can be improved.

Figure 25:
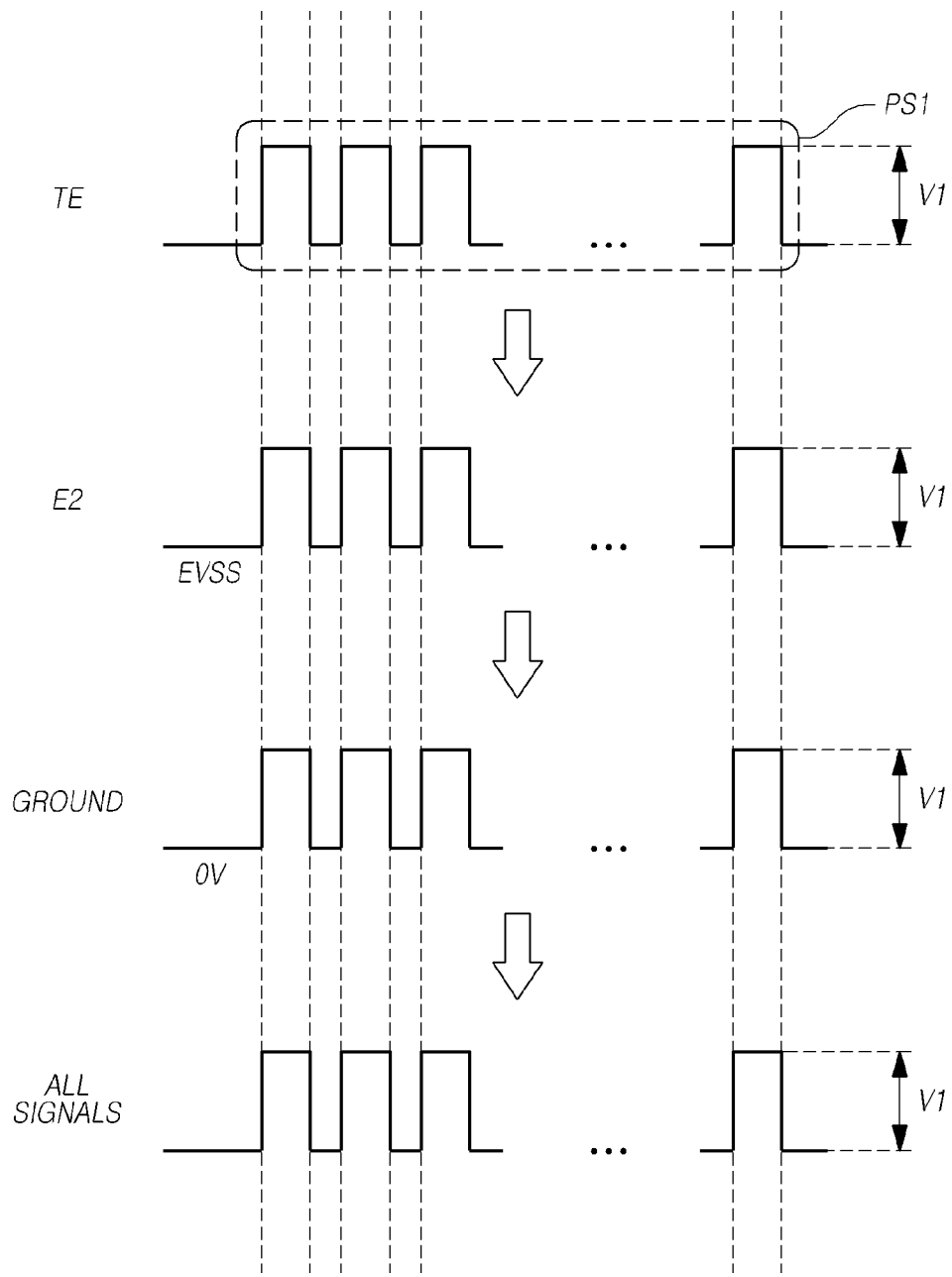
FIG. 25 is a schematic view illustrating major signal waveforms formed by integrated driving in a display mode period when the display device having a built-in touchscreen according to exemplary embodiments is an organic light-emitting display device.

FIG. 25 is a schematic view illustrating major signal waveforms formed by integrated driving in a display mode period when the display device 100 having a built-in touchscreen according to exemplary embodiments is an organic light-emitting display device.

As described above, during the display mode period, when data voltages VDATA-1 to VDATA-M, to be supplied to the M number of subpixels SP_1 to SP_M, are supplied sequentially to the data line DL connected to the M number of subpixels SP_1 to SP_M, a first pulse signal PS1 is applied to the touch line TL electrically connected to the data line DL.

Thus, during the display mode period, the first pulse signal PS1 is applied to the touch electrode TE.

As illustrated in FIG. 21 and FIG. 23, the encapsulation layer L14 corresponding to an insulating layer is disposed between the touch electrode TE and the second electrode layer L13.

Due to this configuration, during the display mode period, in response to the first pulse signal PS1 being applied to the touch electrode TE, the voltage (e.g. EVSS) of the second electrode E2 may swing in response to the first pulse signal PS1, with respect to a DC voltage that should have been applied to the second electrode E2.

For example, when the difference in voltage (i.e. amplitude) between a higher level voltage and a lower level voltage of the first pulse signal PS1 is V1, the level of the voltage (e.g. EVSS) of the second electrode E2 fluctuates by V1 with respect to the DC voltage.

Referring to FIG. 25, in the display mode period, a ground voltage that may correspond to the voltage (e.g. EVSS) of the second electrode E2 may swing in response to the first pulse signal PS1.

As described above, as the level of the ground voltage fluctuates, all signals in the display panel 110 may fluctuate in the same pattern.

At this time, the level of the data voltage VDATA may also fluctuate in the same pattern.

Here, all signals fluctuate by the same amplitudes while maintaining voltage levels.

Since all signals fluctuate in the same pattern in response to the ground voltage fluctuating during the display mode period as described above, the first pulse signal PS1 being applied to the touch line TL and the touch electrode TE during the display mode period does not have an effect on image display performance. It is therefore possible to provide integrated driving that allows the number of the pads to be reduced without having an effect on image display performance.

Figure 26:
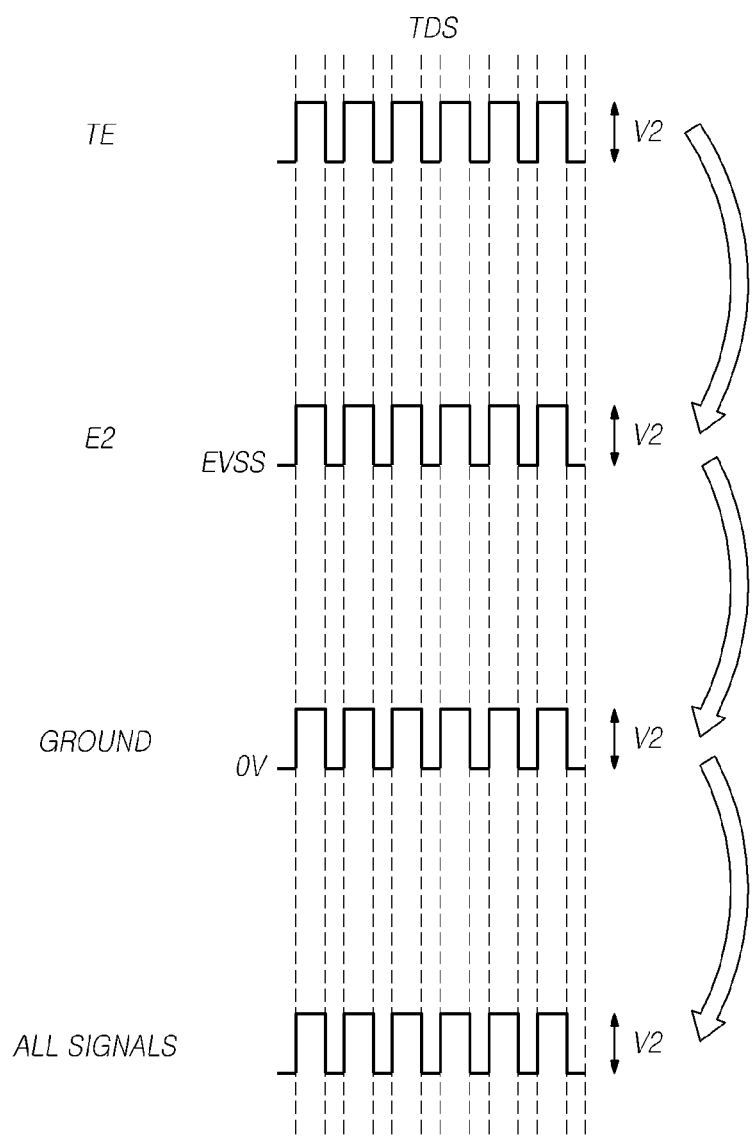
FIG. 26 is a schematic view illustrating major signal waveforms formed by integrated driving in a touch mode period when the display device having a built-in touchscreen according to exemplary embodiments is an organic light-emitting display device.

FIG. 26 is a schematic view illustrating major signal waveforms formed by integrated driving in a touch mode period when the display device 100 having a built-in touchscreen according to exemplary embodiments is an organic light-emitting display device.

Referring to FIG. 26, during the touch mode period, all signals may fluctuate in the same principle as in the display mode period.

Referring to FIG. 26, during the touch mode period, as the touch driving signal TDS in the form of a pulse signal having an amplitude V2 is applied to the touch electrode TE, the level of the voltage of the second electrode E2 spaced apart from the touch electrode TE with the encapsulation layer L14 being disposed therebetween fluctuates following the pulse waveform of the touch driving signal TDS.

Referring to FIG. 26, during the touch mode period, the level of a ground voltage that may correspond to the voltage (e.g. EVSS) of the second electrode E2 may swing in response to the touch driving signal TDS that is a pulse signal having an amplitude V2.

As described above, all signals in the display panel 110 may fluctuate in the same pattern as the ground voltage fluctuates.

Here, the level of the data voltage VDATA may fluctuate in the same pattern.

Here, all signals fluctuate by the same amplitudes while maintaining their voltage levels.

Figure 27:
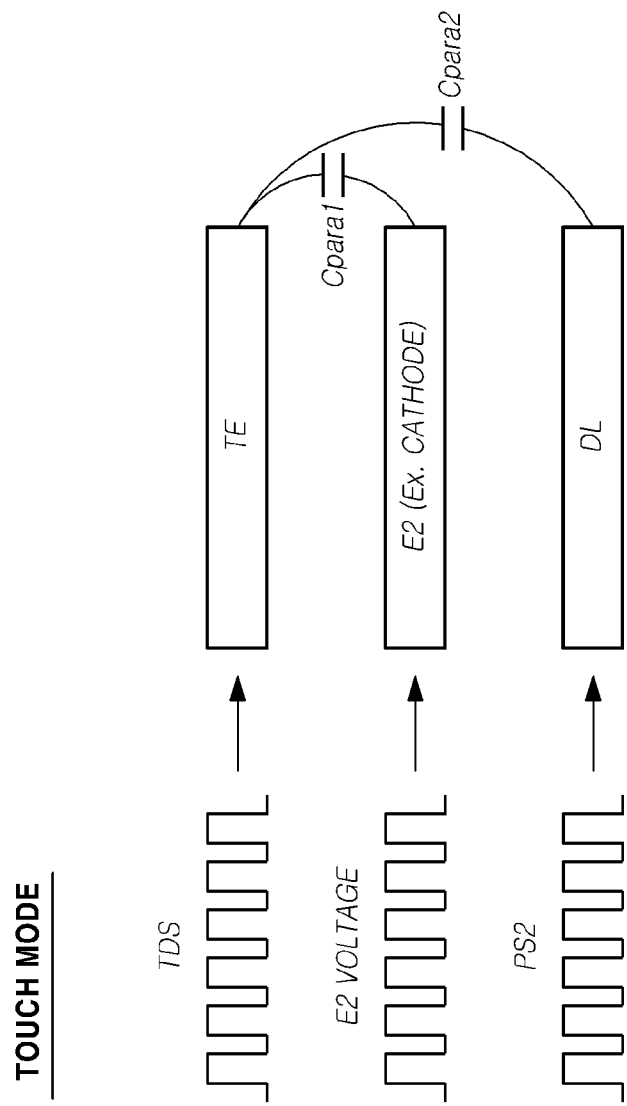
FIG. 27 is a schematic view illustrating a load-reducing effect due to integrated driving when the display device having a built-in touchscreen according to exemplary embodiments is an organic light-emitting display device.

FIG. 27 is a schematic view illustrating a load-reducing effect due to integrated driving when the display device 100 having a built-in touchscreen according to exemplary embodiments is an organic light-emitting display device.

As described above, during the touch mode period, when a touch driving signal TDS is applied to the touch electrode TE, a second pulse signal PS2 corresponding to the touch driving signal TDS is applied to the data line DL electrically connected to the touch electrode TE.

When the touch driving signal TDS is applied to the touch electrode TE during the touch mode period, the level of the voltage of the second electrode E2 swings in response to the touch driving signal TDS.

Thus, during the touch mode period, signals having the same phases may be applied to all of the touch electrode TE, the second electrode E2, and the data line DL.

Consequently, parasitic capacitance Cpara1 between the touch electrode TE and the second electrode E2 and parasitic capacitance Cpara2 between the touch electrode TE and the data line DL can be prevented or reduced.

Figure 28:
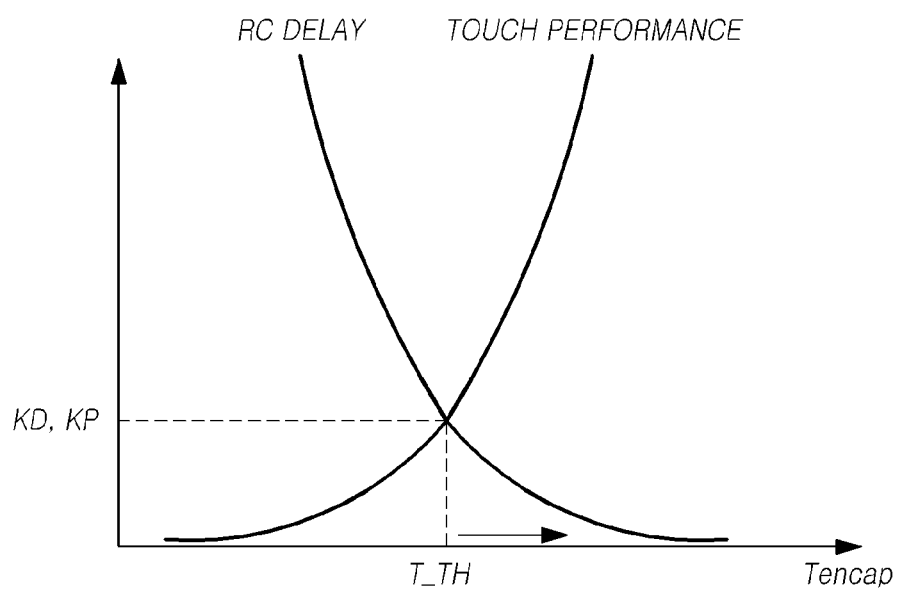
FIG. 28 is a graph illustrating RC delay and touch performance according to the thickness of the encapsulation layer in the display device having a built-in touchscreen according to exemplary embodiments.

FIG. 28 is a graph illustrating RC delay and touch performance according to the thickness Tencap of the encapsulation layer L14 in the display device having a built-in touchscreen according to exemplary embodiments.

Referring to FIG. 28, in the display panel 110 having a built-in touchscreen and based on the TOE structure, when the thickness Tencap of the encapsulation layer L14 decreases, parasitic capacitance between the encapsulation layer L14 and the touch electrode TE increases. This consequently increases RC delay while reducing touch performance (touch sensitivity).

Referring to FIG. 28, in the display panel 110 having a built-in touchscreen and based on the TOE structure, when the thickness Tencap of the encapsulation layer L14 increases, the parasitic capacitance between the encapsulation layer L14 and the touch electrode TE decreases. This consequently reduces RC delay while improving touch performance (touch sensitivity).

As described above, the thickness Tencap of the encapsulation layer L14 should be set to a value such that the level of RC delay is equal to or lower than a maximum allowable value of RC delay KD and the lowest level of touch performance is equal to or higher than a lowest level of touch performance KP.

Consequently, the thickness Tencap of the encapsulation layer L14 must be equal to or greater than a thickness T_TH1 corresponding to the maximum allowable value of RC delay KD and lowest level of touch performance KP.

In this regard, the thickness Tencap of the encapsulation layer L14 can be 5 µm or greater.

This feature can prevent the encapsulation layer L14 from lowering touch sensitivity in the display panel 110 having a built-in touchscreen and based on the TOE structure.

Figure 29:
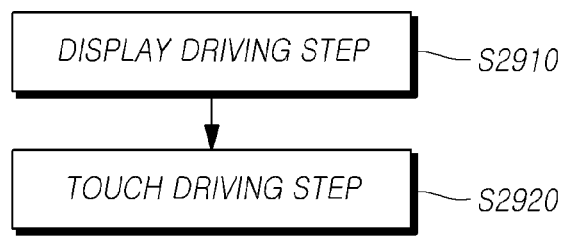
FIG. 29 is a flowchart illustrating a driving method of the display device having a built-in touchscreen according to exemplary embodiments.

FIG. 29 is a flowchart illustrating a driving method of the display device 100 having a built-in touchscreen according to exemplary embodiments.

Referring to FIG. 29, the driving method of the display device 100 having a built-in touchscreen according to exemplary embodiments includes: step S2910 of outputting subpixel-specific data voltages VDATA sequentially to data lines DL disposed on the display panel 110 during a display mode period; and step S2920 of outputting touch driving signals TDS to touch lines TL electrically connected to touch electrodes TE disposed on the display panel 110 during a touch mode period.

In the display mode period, when the subpixel-specific data voltages VDATA are applied to the data lines DL, the subpixel-specific data voltages VDATA can also be applied to the touch lines TL electrically connected to the data lines DL.

In the touch mode period, when the touch driving signals TDS are applied to the touch electrodes TE through the touch lines TL, the touch driving signals TDS can also be applied to the data lines DL electrically connected to the touch lines TL.

Since the data lines DL and the touch lines TL are driven both in the display mode period and the touch mode period as described above, the data pads DP and the touch pads TP are not required to be provided separately. This can consequently reduce the pads in the display panel 110 by a significant number and the pads in the driving circuit by a significant number.

According to the exemplary embodiments as set forth above, the display panel 110 having a built-in touchscreen, the display device 100 having a built-in touchscreen, the integrated driving circuit IDC, and the driving method, able to reduce the number of pads required, are provided.

In addition, according to the exemplary embodiments, the display panel 110 having a built-in touchscreen, in which a data voltage for data driving and a touch driving signal for touch driving can be received using the same integrated pad, the display device 100 including the display panel having a built-in touchscreen, the integrated driving circuit IDC, and the driving method are provided.

Furthermore, according to the exemplary embodiments, the organic light-emitting display panel 110 having a built-in touchscreen, the organic light-emitting display device 100 having a built-in touchscreen, the integrated driving circuit, and the driving method are provided.

In addition, according to the exemplary embodiments, touch electrodes are formed directly on an encapsulation layer in the organic light-emitting display panel having more advantages than other types of display panels, thereby advantageously reducing material costs and investment costs due to the omission of a conventional in-cell standard process. In addition, since the touch electrodes are formed directly, it is not required to bond a touch panel including the touch electrodes to the organic light-emitting display panel. This consequently removes bonding tolerances as well as the thickness of bonded materials, thereby being advantageous in terms of implementing a higher resolution and a higher aperture ratio.

The foregoing descriptions and the accompanying drawings have been presented in order to explain certain principles of the present disclosure. A person skilled in the art to which the disclosure relates could make many modifications and variations by combining, dividing, substituting for, or changing the elements without departing from the principle of the disclosure. The foregoing embodiments disclosed herein shall be interpreted as illustrative only but not as limitative of the principle and scope of the disclosure. It should be understood that the scope of the disclosure shall be defined by the appended Claims and all of their equivalents fall within the scope of the disclosure.

What is claimed is:

1. A display device comprising:
   a substrate including an active area and a non-active area;
   an encapsulation layer over the substrate, the encapsulation layer having a sloped surface in the non-active area;
   a plurality of mesh shaped touch electrodes on the encapsulation layer, the plurality of mesh shaped touch electrodes driven by self-capacitance based touch sensing;

a plurality of touch lines on the encapsulation layer, the plurality of touch lines being on the sloped surface of the encapsulation layer and thereby having a corresponding slope;

an insulating layer between the plurality of mesh shaped touch electrodes and the plurality of touch lines, wherein at least one of the plurality of mesh shaped touch electrodes is electrically connected to at least one of the plurality of touch lines through a contact hole of the insulating layer;

a pad electrically connected to the at least one of the plurality of touch lines in the non- active area; and a dam between the pad and the non-active area;

wherein the plurality of touch lines are located on the dam.

2. The display device of claim 1, further comprising:
an integrated driving circuit electrically connected to a plurality of pads, the integrated driving circuit driving at least one of a plurality of data lines and the at least one of the plurality of touch lines via the pads.

3. The display device of claim 2, wherein the integrated driving circuit comprises:
a first input node through which a data voltage is input;
a second input node through which a touch driving signal is input;
an output node through which the data voltage or the touch driving signal is output to the plurality of pads; and
a switching circuit electrically connecting one of the first input node or the second input node to the output node depending on a driving mode of the display device.

4. The display device of claim 1, further comprising:
a plurality of data lines located in the active area between the substrate and the encapsulation layer,
wherein the plurality of data lines passes under the dam and extends up to the non-active area.

5. The display device of claim 4, wherein the plurality of touch lines correspond to the plurality of data lines.

6. The display device of claim 5, wherein a first electrode formed of a material identical to the plurality of touch lines in the non-active area contacts the at least one of the plurality of touch lines.

7. The display device of claim 1, wherein each of the plurality of mesh shaped touch electrodes has a rectangular outer shape and includes at least one opening in each of the plurality of mesh shaped touch electrodes.

8. The display device of claim 1, wherein the display panel further comprises link lines electrically connecting a plurality of data lines and the plurality of touch lines to a plurality of pads.

9. The display device of claim 1, wherein the display panel comprises at least one light emitting device,
wherein the encapsulation layer is located on the at least one light emitting device, the plurality of touch lines and the plurality of mesh shaped touch electrodes located on the encapsulation layer.

10. The display device of claim 1, wherein the plurality of touch lines are located on a same layer as the plurality of mesh shaped touch electrodes.

11. The display device of claim 1, wherein the plurality of touch lines are located on a different layer from the plurality of mesh shaped touch electrodes.

12. The display device of claim 1, wherein the plurality of mesh shaped touch electrodes are arranged in a matrix of X number of rows and Y number of columns, and a first touch electrode of the plurality of mesh shaped touch electrodes overlaps a subset of subpixels arranged in M number of rows and N number of columns,
wherein one of the X number of rows or the Y number of columns is a natural number equal to or greater than 1, a remaining one of the X number of rows or the Y number of columns is a natural number equal to or greater than 2, each of the M number of rows and the N number of columns is a natural number equal to or greater than 1, and the N is equal to or greater than the X.

* * * * *